US009698388B2

(12) United States Patent
Nirengi et al.

(10) Patent No.: US 9,698,388 B2
(45) Date of Patent: Jul. 4, 2017

(54) TOP-EMISSION ORGANIC ELECTROLUMINESCENCE DISPLAY DEVICE AND PRODUCTION METHOD THEREFOR

(71) Applicant: DAI NIPPON PRINTING CO., LTD., Tokyo-to (JP)

(72) Inventors: Takayoshi Nirengi, Tokyo (JP); Toshihiko Takeda, Tokyo (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

(21) Appl. No.: 14/913,582

(22) PCT Filed: Aug. 28, 2014

(86) PCT No.: PCT/JP2014/072601
§ 371 (c)(1),
(2) Date: Feb. 22, 2016

(87) PCT Pub. No.: WO2015/030124
PCT Pub. Date: Mar. 5, 2015

(65) Prior Publication Data
US 2016/0211488 A1    Jul. 21, 2016

(30) Foreign Application Priority Data

Sep. 2, 2013    (JP) ................... 2013-181292
Aug. 27, 2014    (JP) ................... 2014-172963

(51) Int. Cl.
H01L 51/56    (2006.01)
H01L 51/52    (2006.01)
H01L 27/32    (2006.01)

(52) U.S. Cl.
CPC .......... H01L 51/56 (2013.01); H01L 27/3246 (2013.01); H01L 27/3248 (2013.01);
(Continued)

(58) Field of Classification Search
CPC . H01L 51/56; H01L 27/3248; H01L 27/3246; H01L 51/5212; H01L 51/5228
(Continued)

(56) References Cited

U.S. PATENT DOCUMENTS

2002/0011783 A1    1/2002 Hosokawa
2004/0253756 A1    12/2004 Cok et al.
(Continued)

FOREIGN PATENT DOCUMENTS

CN    1674749 A    9/2005
CN    1917725 A    2/2007
(Continued)

OTHER PUBLICATIONS

Oct. 7, 2014 Search Report issued in International Patent Application No. PCT/JP2014/072601.
(Continued)

Primary Examiner — Jerome Jackson, Jr.
Assistant Examiner — Bo Fan
(74) Attorney, Agent, or Firm — Oliff PLC

(57) ABSTRACT

A top-emission organic EL display device includes a substrate, pixel electrodes, auxiliary electrode, insulating layer formed between the pixel electrodes and includes an opening to expose the auxiliary electrode, organic EL layer formed on the pixel electrodes and includes organic layers, at least one formed on the auxiliary electrode, a contact portion being an opening of the organic layer formed on the auxiliary electrode, and transparent electrode layer formed on the organic EL layer and the contact portion. When an insulating layer overlap distance between the contact portion and pixel electrode adjacent to the contact portion with respect to the pixel electrode is regarded as "a" and an insulating layer overlap distance between the contact portion and pixel electrode adjacent to the contact portion with
(Continued)

respect to the auxiliary electrode is regarded as "b", at least one of "a" and "b" is equal to or greater than 2 μm.

1 Claim, 6 Drawing Sheets

(52) U.S. Cl.
CPC ...... *H01L 51/5212* (2013.01); *H01L 51/5228* (2013.01); *H01L 2251/5315* (2013.01)

(58) Field of Classification Search
USPC .............. 438/99, 34; 257/40, 59, 88; 445/24
See application file for complete search history.

(56) References Cited

U.S. PATENT DOCUMENTS

| | | | |
|---|---|---|---|
| 2005/0051776 A1 | 3/2005 | Miyagi et al. | |
| 2005/0212003 A1* | 9/2005 | Murakami | H01L 51/5088 257/98 |
| 2007/0080356 A1 | 4/2007 | Nakayama et al. | |
| 2008/0287028 A1* | 11/2008 | Ozawa | H01L 51/56 445/24 |
| 2009/0015151 A1 | 1/2009 | Ishihara et al. | |
| 2009/0061724 A1 | 3/2009 | Cok et al. | |
| 2009/0179573 A1 | 7/2009 | Kang et al. | |
| 2011/0215329 A1 | 9/2011 | Chung | |
| 2012/0318447 A1 | 12/2012 | Ozawa | |
| 2013/0056719 A1 | 3/2013 | Komatsu et al. | |
| 2013/0285042 A1 | 10/2013 | Komatsu et al. | |

FOREIGN PATENT DOCUMENTS

| | | |
|---|---|---|
| JP | 2005-031645 A | 2/2005 |
| JP | 2005-276542 A | 10/2005 |
| JP | 2007-052966 A | 3/2007 |
| JP | 2008-288074 A | 11/2008 |
| JP | 2009-283396 A | 12/2009 |
| JP | 4434411 B2 | 3/2010 |
| JP | 4545780 B2 | 9/2010 |
| JP | 2010-538440 A | 12/2010 |
| JP | 2011-090925 A | 5/2011 |
| JP | 2011-186427 A | 9/2011 |
| JP | 4959119 B2 | 6/2012 |
| WO | 2012/114648 A1 | 8/2012 |
| WO | 2012/153445 A1 | 11/2012 |

OTHER PUBLICATIONS

Translation of Jul. 5, 2016 Office Action issued in Japanese Patent Application No. 2015-154173.

* cited by examiner

TOP-EMISSION ORGANIC ELECTROLUMINESCENCE DISPLAY DEVICE AND PRODUCTION METHOD THEREFOR

TECHNICAL FIELD

The present disclosure relates to a top-emission organic electroluminescence display device including an auxiliary electrode.

BACKGROUND ART

Organic electroluminescence elements have drawn attention in terms of advantages such as high visibility by self-coloring, excellent, impact resistance for being an entirely solid display unlike a liquid crystal display device, a fast response rate, small influence by a change in temperature, and a wide viewing angle. Incidentally, hereinafter, in some cases, an organic electroluminescence is abbreviated to organic EL.

The configuration of the organic EL element is based on a laminated structure where an organic EL layer is interposed between an anode and a cathode. As a driving method for the organic EL display device including the organic EL element, there are passive matrix driving and active matrix driving, but the active matrix driving is useful in terms that the active matrix driving can be performed at a low voltage in production of a large-sized display. Incidentally, the active matrix driving denotes a method of driving the organic EL display device by forming a circuit such as TFT on a substrate where the organic EL element is formed and driving the organic EL display device by the circuit such as TFTs.

As the organic EL display device, there are a bottom emission type in which light is emitted from a side close to the substrate side in which the organic EL element is formed and a top emission type where light is emitted from a side opposite to the substrate where the organic EL element is formed. Here, in the case of the active matrix driving organic EL display device, in the bottom emission type, there is a problem in that an aperture ratio is limited by the circuit such as TFT formed on the substrate, which is a light emitting surface, and a light emitting efficiency is deteriorated. In contrast, in the top emission type, since light is emitted, from the surface of the side opposite to the substrate, an excellent light emitting efficiency can be obtained in comparison with the bottom emission type. Incidentally, in the case of the top emission type, a transparent electrode layer is used as an electrode layer of the side which becomes the light emitting surface.

A general transparent electrode layer has high resistance in comparison with an electrode layer comprising a metal such as Al or Cu. For this reason, in the organic EL display device having the transparent electrode layer, voltage drop occurs due to the resistance of the transparent electrode layer, and as a result, uniformity of brightness of the organic EL layer is deteriorated, so that a problem of so-called brightness irregularity occurs. In addition, as an area of the transparent electrode layer is increased, the resistance is increased, and thus, the above-described problem of brightness irregularity becomes remarkable in the case of producing a large-sized display.

With respect to the above-described problem, for example, as disclosed in Patent Document 1, there is known a method of suppressing voltage drop by forming auxiliary electrodes having a low resistance value and electrically connecting the auxiliary electrodes to the transparent electrode layer. Here, the auxiliary electrodes are generally formed in a pattern shape by applying an etching process by a wet process after formation of a metal layer. For this reason, in the top-emission organic EL display device, in the case where the auxiliary electrodes are formed after formation of the organic EL layer, there is a problem in that an etchant used for forming the auxiliary electrode is infiltrated into the organic EL layer. Therefore, as disclosed in Patent Documents 2 to 5, there is known a method of forming the auxiliary electrodes before formation of the organic EL layer.

However, if the auxiliary electrodes are formed before formation of the organic EL layer, in the case where the organic EL layer is to be formed on the entire surface or in the case where at least one of the organic layers constituting the organic EL layer is formed on the entire surface, the organic EL layer or the at least one layer of the organic layers is formed on the auxiliary electrodes. For this reason, there is a problem in that connection between the auxiliary electrodes and the transparent electrode layer may be prevented by the organic EL layer or the organic layer on the auxiliary electrodes.

Therefore, in Patent Documents 2 to 3, there is proposed a method of producing the organic EL display device where the organic EL layer on the auxiliary electrodes is removed by a laser beam and the auxiliary electrode and the transparent electrode layer are electrically connected to each other. However, in this case, the organic EL layer removed by the laser beam is scattered, and thus, pixel areas of the organic EL display device are contaminated, so that there is a problem in that display characteristics are deteriorated.

In addition, as a method of solving the above-described problem, for example, in Patent Document 4, there is proposed a method of forming a first electrode having light transmissivity on the entire surfaces of the auxiliary electrodes covered with the organic EL layer before removing the organic EL layer by a laser beam, after that, removing the organic EL layer by the laser beam through the first electrode, and finally, forming a second electrode. However, in this case, although the above-described deterioration in display characteristics can be suppressed, since the first electrode and the second electrode are formed as the transparent electrode layers, there is a problem in that the number of production processes is increased.

CITATION LIST

Patent Documents

Patent Document 1: Japanese Patent No. 4434411
Patent Document 2: Japanese Patent No. 4959119
Patent Document 3: Japanese Patent No. 4545780
Patent Document 4: Japanese Translation of PCT International Application Publication No. JP-T-2010-538440
Patent Document 5: Japanese Patent No. 4340982

SUMMARY

Technical Problem

Patent Document 5 discloses a production method for an organic EL display device as a method of preventing the organic layers removed by the laser beam so as to form the contact portions connecting the auxiliary electrodes and the transparent electrode layer from contaminating the display device, as follows. Namely, as illustrated in FIG. 6A, pixel electrodes 30 and an auxiliary electrode 40 are formed on a substrate 20, and an insulating layer 50 is formed between the pixel electrodes 30 and the auxiliary electrode 40, and after that, as illustrated in FIG. 6B, an organic EL layer 60 is formed, so that an organic EL layer side substrate 100' is formed. Next, as illustrated in FIG. 6C, under a reduced pressure, a cover member 80 is allowed to face the organic EL layer side substrate 100' so that the cover member 80 is arranged so as to be in contact with top portions of the insulating layer 50, and a space V between the organic EL layer side substrate 100' and the cover member 80 is set to be in a reduced pressure state. After that, by pressuring an outer peripheral space of the organic EL layer side substrate 100' and the cover member 80, the cover member 80 is allowed to be adhered to the organic EL layer side substrate 100'. Next, the organic EL layer 60 on the auxiliary electrode 40 is removed by a laser beam L, and as illustrated in FIG. 6D, the cover member 80 is peeled off. Finally, as illustrated in FIG. 6E, a transparent electrode layer 70 is formed on the organic EL layer side substrate, so that an organic EL display device 100, in which the auxiliary electrode 40 and the transparent electrode layer 70 are electrically connected to each other in the contact portions, is formed. The organic EL display device is produced by the above-described method, and thus, dust, for example, of the organic EL layers removed by illumination with the laser beam can be prevented from being scattered into the pixel areas, so that deterioration in display characteristics can be prevented.

Therefore, the inventors carried out various studies on the organic EL display device produced by using the above-described method and paid attention to the following points. Namely, the inventors paid attention to the phenomenon that, since the insulating layer is formed so as to overlap at least the pixel electrodes, with respect to the top portions of the insulating layer formed by illuminating with the laser beam between the area where the contact portions are to be formed and the adjacent pixel electrodes, height difference occurs between the top portions of the area where the insulating layer overlaps the pixel electrodes and the top portions of the area where the insulating layer does not overlap the pixel electrodes. As a result, if the area, in which the height of the insulating layer is high, is narrow, as illustrated in FIG. 6C, when the cover member 80 is allowed to face the organic EL layer side substrate 100' under a reduced pressure and a space V between the organic EL layer side substrate 100' and the cover member 80 is set to be in a reduced pressure state, the area where the organic EL layer side substrate 100' and the cover member 80 are in contact with each other is also narrow, and thus, a problem is found in that it is difficult to sufficiently adhere the organic EL layer side substrate and the cover member by setting the space between the organic EL layer side substrate 100' and the cover member 80 to be in a reduced pressure state. Incidentally, if it is difficult to sufficiently adhere the organic EL layer side substrate and the cover member, as illustrated in FIG. 6C, when the contact portions are to be formed by illuminating with the laser beam L, a problem occurs in that dust, for example, of the organic EL layer 60 removed by illumination with the laser beam is not sufficiently prevented from being scattered into the pixel area and deterioration in display characteristics cannot be suppressed.

The present disclosure has been made in a nod to the above-described circumstances, and a main object thereof is to suppress deterioration in display characteristics by sufficiently preventing organic layers removed by a laser beam from being scattered into pixel areas in the following processes of: first, allowing a cover member to be in contact with an insulating layer between areas where a contact portion is to be formed and a pixel electrode adjacent to the areas, and setting a space between the organic EL layer side substrate, in which the pixel electrodes, auxiliary electrodes, the insulating layer, and an organic EL layer are formed on a substrate, and the cover member to be in a reduced pressure state; next, allowing the organic EL layer side substrate and the cover member to be adhered to each other by adjusting a pressure of a space on an opposite side to the organic EL layer side substrate, in relation to the cover member; and after that, removing the organic layer covering the auxiliary electrode exposed from an opening of the insulating layer by illuminating with a laser beam in order to form the contact portion.

Solution to Problem

In order to achieve the above object, an embodiment of the present invention provides a top-emission organic EL display device comprising: a substrate; a plurality of pixel electrodes formed on the substrate; an auxiliary electrode formed between the pixel electrodes adjacent to each other; an insulating layer which is formed between the adjacent pixel electrodes so as to cover edge portions of the adjacent pixel electrodes and comprises an opening so as to expose the auxiliary electrode; an organic EL layer which is formed on the pixel electrode, comprises a plurality of organic layers, and includes at least a light-emitting layer; at least one layer of the organic layers formed on the auxiliary electrode exposed from the opening of the insulating layer; a contact portion which is an opening of the organic layer formed on the auxiliary electrode exposed from the opening of the insulating layer; and a transparent electrode layer formed on the organic EL layer and the contact portion, characterized in that, when an overlap distance of the insulating layer between the contact portion and the pixel electrode adjacent to the contact portion with respect to the pixel electrode is regarded as "a" and an overlap distance of the insulating layer between the contact portion and the pixel electrode adjacent to the contact portion with respect to the auxiliary electrode is regarded as "b", at least one of "a" and "b" is equal to or greater than 2 μm, and the transparent electrode layer is electrically connected to the auxiliary electrode in the contact portion.

According to an embodiment of the present invention, the above-described at least one of "a" and "b" is equal to or greater than 2 μm, so that, when allowing the cover member to be in contact with the insulating layer between the contact portion forming areas and the pixel electrode adjacent to the contact portion forming areas in order to form the contact portion, the area in the insulating layer which is adhered to the cover member can be sufficiently ensured, and the adhesion can be improved. For this reason, when setting the space between the organic EL layer side substrate, in which the pixel electrodes, the auxiliary electrodes, the insulating layer, and the organic EL layer are formed on the substrate, and the cover member to be in a reduced pressure state to allow the organic EL layer side substrate and the cover member to be adhered to each other and removing the organic layer covering the auxiliary electrode exposed from the opening of the insulating layer by illuminating with the laser beam, the organic layer removed by the laser beam can be sufficiently prevented from being scattered into the pixel areas, so that deterioration in display characteristics can be suppressed.

In an embodiment of the present invention, when the height of the insulating layer between the contact portion and the pixel electrode adjacent to the contact portion is regarded as "x" and a maximum height of the heights of the insulating layer other than the insulating layer between the contact portion and the pixel electrode adjacent to the contact portion is regarded as "y", it is preferable that the following relation is satisfied: y−x≤0.05 μm. The difference between the height "x" and the height "y" is 0.05 μm or less, so that, when allowing the cover member to be in contact with the insulating layer between the areas where the contact portion is to be formed and the pixel electrode adjacent to the areas, and setting the space between the organic EL layer side substrate, in which the pixel electrodes, the auxiliary electrodes, the insulating layer, and the organic EL layer are formed on the substrate, and the cover member to be in a reduced pressure state to allow the organic EL layer side substrate and the cover member to be adhered to each other in order to form the contact portion, the insulating layer between the contact portion and the pixel electrode adjacent to the contact portion and the cover member can be sufficiently adhered to each other. Therefore, the organic layers removed by the laser beam in the contact portion forming period can be effectively prevented from being scattered into the pixel areas, so that deterioration in display characteristics can be suppressed.

An embodiment of the present invention provides a production method for a top-emission organic EL display device, the top-emission organic EL display device comprising a substrate, a plurality of pixel electrodes formed on the substrate, an auxiliary electrode formed between the pixel electrodes adjacent to each other, an insulating layer which is formed between the adjacent pixel electrodes so as to cover edge portions of the adjacent pixel electrodes and comprises an opening so as to expose the auxiliary electrode, an organic EL layer which is formed on the pixel electrodes, comprises a plurality of organic layers, and includes at least a light-emitting layer, at least one layer of the organic layers formed on the auxiliary electrode exposed from the opening of the insulating layer, a contact portion which is an opening of the organic layer formed on the auxiliary electrode exposed from the opening of the insulating layer, and a transparent electrode layer formed on the organic EL layer and the contact portion, in which, when an overlap distance of the insulating layer between the contact portion and the pixel electrode adjacent to the contact portion with respect to the pixel electrode is regarded as "a" and an overlap distance of the insulating layer between the contact portion and the pixel electrode adjacent to the contact portion with respect to the auxiliary electrode is regarded as "b", at least one of "a" and "b" is equal to or greater than 2 μm, and the transparent electrode layer is electrically connected to the auxiliary electrode in the contact portion; the production method for a top-emission organic EL display device comprising processes of: an organic EL layer side substrate preparing process of preparing an organic EL layer side substrate comprising the substrate, the pixel electrodes, the auxiliary electrode, the insulating layer, and the organic EL layer, and at least one layer of the organic layers is formed on an entire surface of the auxiliary electrode, an arrangement process of arranging a cover member to face the organic EL layer side substrate obtained in the organic EL layer side substrate preparing process under a first pressure, so that the cover member is in contact with a top portion of the insulating layer by the intermediary of the organic layer, an adhering process of adhering the organic EL layer side substrate and the cover member by adjusting a space on an opposite side to the organic EL layer side substrate, in relation to the cover member, to have a second pressure which is higher than the first pressure, and a contact portion forming process of forming the contact portion by removing the organic layer covering the auxiliary electrode exposed from the opening of the insulating layer by illuminating with a laser beam through the cover member.

In an embodiment of the present invention, the above-described at least one of "a" and "b" is equal to or greater than 2 μm, so that the areas in the insulating layer which is adhered to the cover member in the adhering process can be sufficiently ensured and, thus, the adhesion can be improved. Therefore, in the insulating layer, the organic layers removed by the laser beam in the contact portion forming process can be effectively prevented from being scattered into the pixel areas, so that it is possible to obtain a top-emission organic EL display device capable of suppressing deterioration in display characteristics.

Advantageous Effects of Disclosure

In an embodiment of the present invention, through the processes of: first, allowing the cover member to be in contact with the insulating layer between the areas where the contact portions are to be formed and the pixel electrodes adjacent to the areas under a first pressure and setting the space between the organic EL layer side substrate, in which the pixel electrodes, the auxiliary electrodes, the insulating layer, and the organic EL layer are formed on the substrate, and the cover member to be in a reduced pressure state; next, allowing the organic EL layer side substrate and the cover member to be adhered to each other by adjusting the space of the side of the cover member opposite to the organic EL layer side substrate to have a second pressure; and after that, removing the organic layer covering the auxiliary electrode exposed from the opening of the insulating layer by illuminating with a laser beam in order to form the contact portion; the organic layer removed by the laser beam can be sufficiently prevented from being scattered into the pixel areas, so that it is possible to obtain the effect that deterioration in display characteristics can be suppressed.

Incidentally, as a pressure for the "first pressure" and the "second pressure", it is not particularly limited if the first pressure is a lower pressure than the second pressure. In addition, any pressures to the extent that, when adjusting the pressure of the space between the organic EL layer side substrate and the cover member at the time of arranging the cover member on the surface of the organic EL layer side substrate to be the first pressure and adjusting the pressure of the space of the side of the cover member opposite to the organic EL layer side substrate to the second pressure, the organic EL layer side substrate and the cover member can be adhered to each other by a pressure difference between the pressure between the organic EL layer side substrate and the cover member and the pressure of the space of the side of the cover member opposite to the organic EL layer side substrate may be employed without particular limitation. Incidentally, in general, the "first pressure" is set to a pressure lower than a normal pressure, and the "second pressure" is set to a pressure higher than the "first pressure". In addition, since the "first pressure" is described in the later-described Section "B. Production Method for Organic EL Display Device", the description thereof is omitted herein.

DESCRIPTION OF EMBODIMENTS

Hereinafter, a top-emission organic EL display device according to an embodiment of the present invention and a production method therefor will be described in detail. Incidentally, hereinafter, in some cases, the top-emission organic EL display device is abbreviated to an organic EL display device.

A. Organic EL Display Device

An organic EL display device according to an embodiment of the present invention comprises a substrate, a plurality of pixel electrodes formed on the substrate, an auxiliary electrode formed between the pixel electrodes adjacent to each other, an insulating layer which is formed between the adjacent pixel electrodes so as to cover edge portions of the adjacent pixel electrodes and comprises an opening so as to expose the auxiliary electrode, an organic EL layer which is formed on the pixel electrodes, comprises a plurality of organic layers, and includes at least a light-emitting layer, at least one layer of the organic layers formed on the auxiliary electrodes exposed from the opening of the insulating layer, a contact portion which is an opening of the organic layers formed on the auxiliary electrode exposed from the opening of the insulating layer, and a transparent electrode layer formed on the organic EL layer and the contact portion; wherein when an overlap distance of the insulating layer between the contact portion and the pixel electrode adjacent to the contact portion with respect to the pixel electrode is regarded as "a" and an overlap distance of the insulating layer between the contact portion and the pixel electrode adjacent to the contact portion with respect to the auxiliary electrode is regarded as "b", at least one of "a" and "b" is equal to or greater than 2 μm; and the transparent electrode layer is electrically connected to the auxiliary electrode in the contact portion.

Figure 1A:
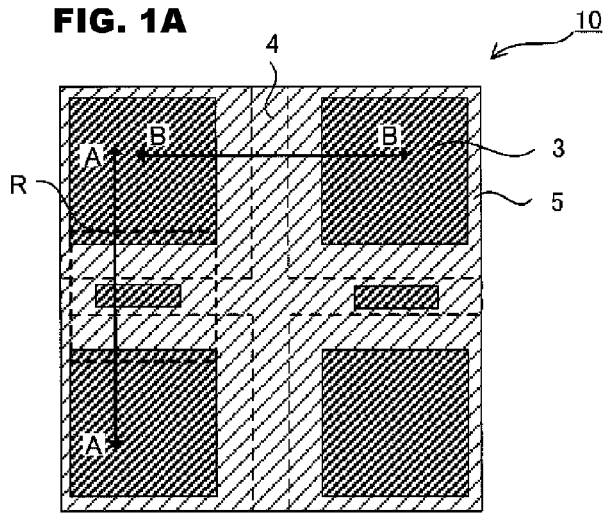
FIGS. 1A to 1D are schematic views illustrating an example of a top-emission organic EL display device according to an embodiment of the present invention.
Figure 1B:
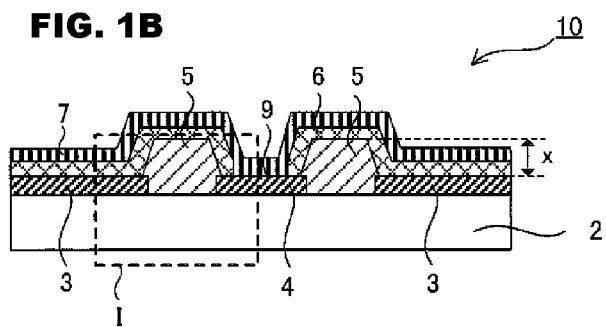
Figure 1C:
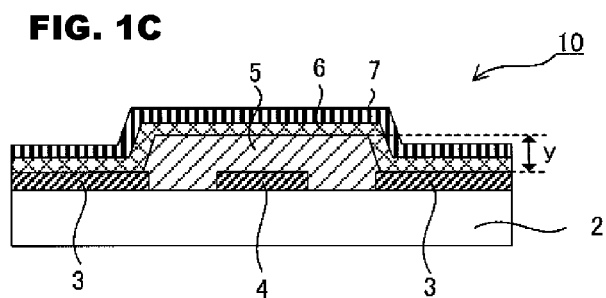
Figure 1D:
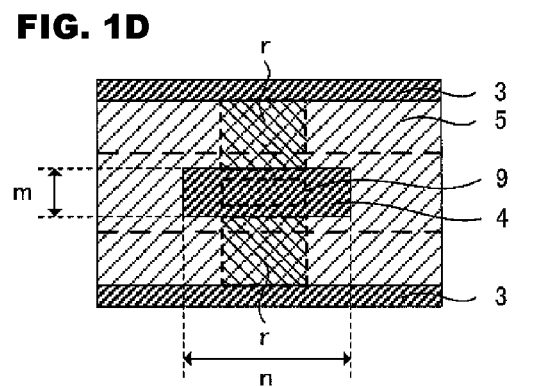

FIGS. 1A to 1C are schematic views illustrating an example of the organic EL display device according to an embodiment of the present invention. FIG. 1B is a sectional view taken along line A-A of FIG. 1A, and FIG. 1C is a sectional view taken along line B-B of FIG. 1A. The organic EL display device 10 according to an embodiment of the present invention has the following configuration as illustrated in FIGS. 1A to 1C. Namely, the organic EL display device has a plurality of pixel electrodes 3 on the substrate 2 and has an auxiliary electrode 4 between the pixel electrodes 3 adjacent to each other. In addition, the organic EL display device has an insulating layer 5 between the pixel electrodes 3 adjacent to each other so as to cover edge portions of the adjacent pixel electrodes 3. Incidentally, an opening is formed in the insulating layer 5 to expose the auxiliary electrode 4. In addition, the organic EL display device has an organic EL layer 6 which comprises a plurality of organic layers on the pixel electrode 3 and includes at least a light-emitting layer. Incidentally, the organic EL display device has at least one layer of the organic layers on the auxiliary electrode 4 exposed from the opening formed in the insulating layer 5, and the opening which becomes a contact portion 9 is formed on at least one layer of the organic layers. In addition, the organic EL display device has a transparent electrode layer 7 on the organic EL layer 6 and the contact portion 9, and the transparent electrode layer 7 is electrically connected to the auxiliary electrode 4 at the contact portion 9. Incidentally, since the explanation about FIG. 1D is described later, the description thereof is omitted herein. In addition, for simplifying the explanation, in FIGS. 1A and 1D, the organic EL layer and the transparent electrode layer of FIGS. 1B and 1C are omitted. In addition, for simplifying the explanation, in FIGS. 1A to 1D, active matrix driving circuits such as a TFT, a wire-line electrode, and a planarization layer are omitted.

Figure 2A:
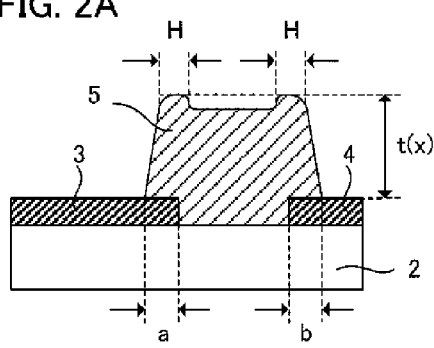
FIGS. 2A and 2B are schematic pattern diagrams illustrating an insulating layer in an embodiment of the present invention.

Here, in the organic EL display device 10 according to an embodiment of the present invention, as illustrated in FIG. 2A, at least one of the overlap distance "a" of the insulating layer 5 between the contact portion and the pixel electrode 3 adjacent to the contact portion with respect to the pixel electrode 3 and the overlap distance "b" of the insulating layer 5 between the contact portion and the pixel electrode 3 adjacent to the contact portion with respect to the auxiliary electrode 4 is equal to or greater than 2 μm. Incidentally, since FIG. 2A is a diagram enlarging the region "I" illustrated in FIG. 1B and the reference numerals not described in FIG. 2A can be set to be the same as those of FIGS. 1A to 1D, the description thereof is omitted herein.

In an embodiment of the present invention, at least one of the above-described "a" and "b" is equal to or greater than 2 μm, so that it is possible to obtain the effect that deterioration in display characteristics can be suppressed when the organic EL display device is produced by, for example, the following method. Hereinafter, a production method for the organic EL display device according to an embodiment of the present invention will be described.

Figure 3A:
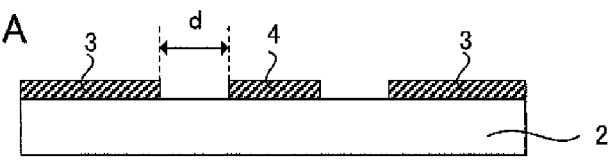
FIGS. 3A to 3F are process diagrams illustrating an example of a production method for a top-emission organic EL display device according to an embodiment of the present invention.
Figure 3B:
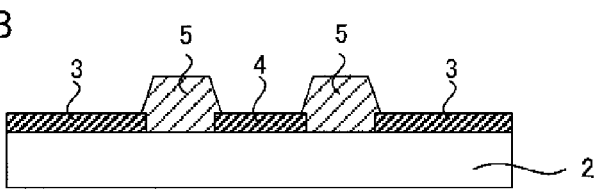
Figure 3C:
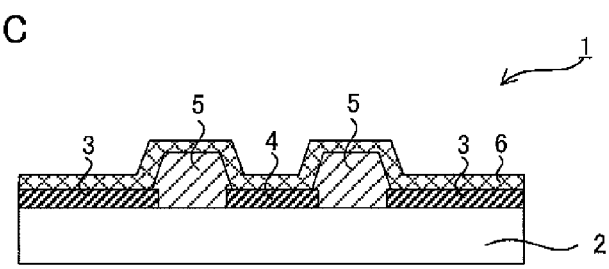
Figure 3D:
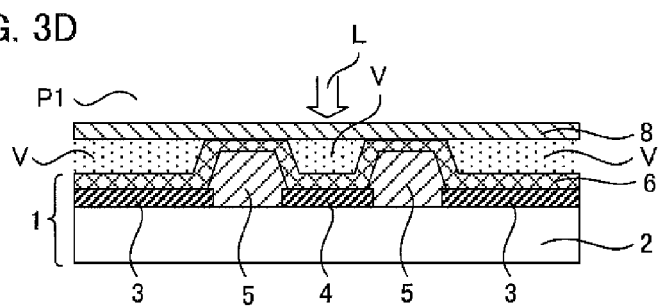
Figure 3E:
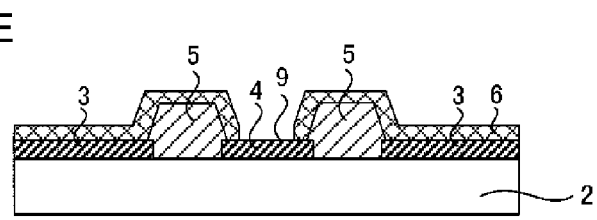
Figure 3F:
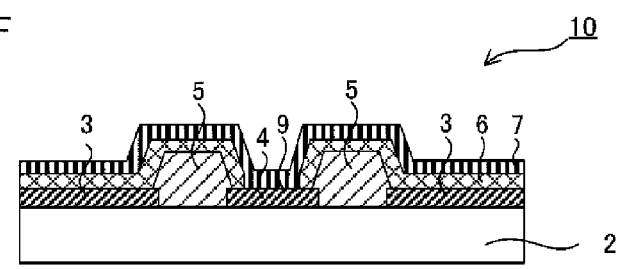

FIGS. 3A to 3F are process diagrams illustrating an example of a production method for the organic EL display device according to an embodiment of the present invention. In addition, FIGS. 3A to 3F are schematic sectional views as observed from the same position as that of FIG. 1B which is the sectional views taken along line A-A of FIG. 1A. First, as illustrated in FIG. 3A, a pixel electrode and auxiliary electrode forming process of forming the pixel electrodes 3 and the auxiliary electrode 4 on the substrate 2 is performed. Next, as illustrated in FIG. 38, an insulating layer forming process of forming the insulating layer 5 having an opening so as to cover the edge portion of the adjacent pixel electrodes 3 and expose the auxiliary electrode 4 is performed. After that, as illustrated in FIG. 3C, an organic EL layer forming process of forming the organic EL layer 6 which comprises a plurality of organic layers and includes at least a light-emitting layer on the pixel electrodes 3 is performed. Incidentally, in the organic EL layer forming process, while the organic EL layer 6 is formed, at least one layer of the organic layers constituting the organic EL layer 6 is formed so as to cover the auxiliary electrode 4 exposed from the opening of the insulating layer 5. In this manner, an organic EL layer side substrate preparing process of preparing the organic EL layer side substrate 1 is performed. Next, as illustrated in FIG. 3D, an arrangement process of arranging a cover member 8 to face the organic EL layer side substrate 1 and arranging the cover member 8 so as to be in contact with a top portion of the insulating layer 5 by the intermediary of the organic EL layer 6 under a first pressure is performed. At this time, the space V between the organic EL layer side substrate 1 and the cover member 8 is in a reduced pressure state. After that, an adhering process of adhering the organic EL layer side substrate 1 and the cover member 8 by adjusting a space P1 of the side of the cover member 8 opposite to the organic EL layer side substrate 1 to be in a second pressure which is higher than the first pressure is performed. Next, as illustrated in FIG. 3E, a contact portion forming process of forming the contact portions 9 by removing the organic EL layer 6 covering the auxiliary electrode 4 exposed from the opening of the insulating layer 5 by illuminating with a laser beam L through the cover member 8 and so as to expose the auxiliary electrode 4 is performed. Finally, as illustrated in FIG. 3F, a transparent electrode layer forming process of forming the transparent electrode layer 7 on the organic EL layer side substrate so as to be electrically connected to the auxiliary electrode 4 exposed in the contact portion 9 is performed. Therefore, the organic EL display device 10 according to an embodiment of the present invention can be obtained. Incidentally, here, the "top portion of the insulating layer" indicates the upper base side of the insulating layer 5 in the case where the longitudinal cross-sectional shape of the insulating layer 5 is trapezoid as illustrated in FIG. 13, and the "top portion of the insulating layer" indicates the apex portion of the insulating layer in the case where the longitudinal cross-sectional shape of the insulating layer is a shape other than trapezoid.

Figure 2B:
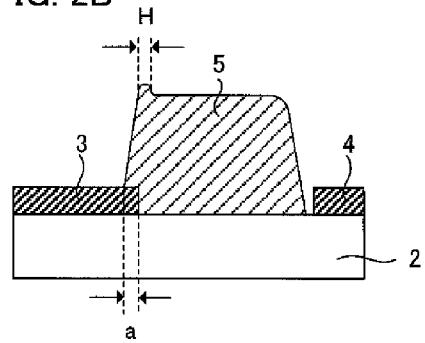

In the case where the organic EL display device according to an embodiment of the present invention is produced by above-described production method, at least one of the overlap distance "a" of the insulating layer between the contact portion and the pixel electrode adjacent to the contact portion with respect to the pixel electrode and the overlap distance "b" of the insulating layer between the contact portion and the pixel electrode adjacent to the contact portion with respect to the auxiliary electrode is equal to or greater than 2 µm, so that, when allowing the cover member to be in contact with the insulating layer between the contact portion forming areas and the pixel electrode adjacent to the contact portion forming areas in order to form the contact portion, the organic layer removed by the laser beam can be effectively prevented from being scattered into the pixel areas, and it is possible to obtain the organic EL display device capable of suppressing deterioration in display characteristics. For the reasons, followings are considered. Namely, for example, as illustrated in FIG. 2A, in the case where the insulating layer 5 overlaps with the pixel electrode 3 and the auxiliary electrode 4 and both of the overlap distance "a" of the insulating layer 5 with respect to the pixel electrode 3 and the overlap distance "b" of the insulating layer 5 with respect to the auxiliary electrode 4 are equal to or greater than 2 µm, the highest region "H" in the top portion of the insulating layer 5 can be obtained by amounts corresponding to the distance "a" and the distance "b". For this reason, it is estimated that, as illustrated in FIG. 3D, when the cover member 8 is allowed to face and the cover member 8 is arranged to the top portion of the insulating layer 5, a sufficient area where the insulating layer 5 and the cover member 8 are adhered to each other can be ensured, and thus, the adhesion can be improved. On the other hand, it is estimated that, as illustrated in FIG. 2B, in the case where the insulating layer 5 overlaps only the pixel electrode 3 and the overlap distance "a" of the insulating layer 5 with respect to the pixel electrode 3 is 2 µm or less, the highest region "H" in the top portion of the insulating layer 5 is narrow in comparison with the case of FIG. 2A, and thus, as illustrated in FIG. 3D, when the cover member 8 is allowed to face under a reduced pressure and the cover member 8 is arranged to the top portion of the insulating layer 5, the area where the insulating layer 5 and the cover member 8 are adhered to each other is not sufficiently ensured and desired adhesion cannot be obtained. In this manner, in the organic EL display device according to an embodiment of the present invention, at least one of the above-described "a" and "b" is equal to or greater than 2 µm, so that the adhesion between the insulating layer and the cover member can be improved, and thus, it is estimated that, when the organic EL display device according to an embodiment of the present invention is produced by the production method illustrated in FIGS. 3A to 3F, dust, for example, of the organic layer removed by the laser beam can be sufficiently prevented from being scattered into the adjacent pixel areas, so that deterioration in display characteristics can be suppressed. Incidentally, since FIG. 2B is a sectional view observed from the same position as FIG. 2A and the reference numerals not described in FIG. 2B can be set to be the same as those of FIGS. 1A to 1D, the description thereof is omitted herein.

Here, in an embodiment of the present invention, the "edge portion of the adjacent pixel electrode" indicates a side surface portion of the pixel electrode formed in an inward-substrate direction substantially perpendicular to a planar direction of the surface of the pixel electrode.

In addition, in an embodiment of the present invention, the "at least one layer of the organic layers formed on the auxiliary electrode exposed from the opening of the insulating layer" includes the aspect where all the layers comprising the organic EL layer 6 are formed on the auxiliary electrode 4 exposed from the opening of the insulating layer 5, for example, as illustrated in FIG. 3C, and besides, granted that in the case where the organic EL layer comprises four layers of a hole injecting layer, a hole transporting layer, a light-emitting layer, and an electron injecting layer, "the at least one layer of the organic layers formed on the auxiliary electrode exposed from the opening of the insulating layer" includes the aspect where three layers of the four layers are formed in a pattern shape on the pixel electrodes and the remaining one layer is formed on the pixel electrodes and on the auxiliary electrode exposed from the opening of the insulating layer, the aspect where two layers of the four layers formed on the pixel electrode and the remaining two layers are formed on the pixel electrodes and the auxiliary electrode exposed from the opening of the insulating layer, and the aspect where one layer of the four layers is formed on the pixel electrodes and the remaining three layers are formed on the pixel electrodes and on the auxiliary electrode exposed from the opening of the insulating layer, for example.

Furthermore, in an embodiment of the present invention, "the overlap distance of the insulating layer between the contact portion and the pixel electrode adjacent to the contact portion with respect to the pixel electrode is regarded as "a"" denotes the overlap distance of the insulating layer 5 with respect to the pixel electrode 3 in the insulating layer 5 between the contact portion 9 formed by removing at least one layer of the organic layers in the opening formed in the insulating layer 5 so as to expose the auxiliary electrode 4 and the pixel electrode 3 facing the contact portion 9, such as a region "r" illustrated in FIG. 1D, for example. More specifically, as illustrated in FIG. 2A, when the insulating layer 5 overlaps the pixel electrode 3, the distance in which the pixel electrode 3 is overlapped is regarded as "a" is denoted. In addition, in an embodiment of the present invention, similarly to the above description, "the overlap distance of the insulating layer between the contact portion and the pixel electrode adjacent to the contact portion with respect to the auxiliary electrode is regarded as "b"" denotes the overlap distance of the insulating layer 5 with respect to the auxiliary electrode 4 in the insulating layer 5 in the region "r", as illustrated in FIG. 1D for example. More specifically, as illustrated in FIG. 2A, when the insulating layer 5 overlaps the auxiliary electrode 4, the distance in which the auxiliary electrode 4 is overlapped is regarded as "b" is denoted. Here, FIG. 1D is an enlarged view of the region "R" of FIG. 1A.

Hereinafter, components of the organic EL display device according to an embodiment of the present invention will be described.

1. Insulating Layer

In an embodiment of the present invention, the insulating layer is formed between the adjacent pixel electrodes so as to cover the edge portions of the adjacent pixel electrodes and comprises the opening so as to expose the auxiliary electrode. In addition, when an overlap distance of the insulating layer between the later-described contact portion and the pixel electrode adjacent to the contact portion with respect to the pixel electrode is regarded as "a" and an overlap distance of the insulating layer between the later-described contact portion and the pixel electrode adjacent to the contact portion with respect to the auxiliary electrode is regarded as "b", at least one of "a" and "b" is equal to or greater than 2 μm.

Since the insulating layer is formed between the pixel electrodes so as to cover the edge portions of the adjacent pixel electrodes, the planar shape of the insulating layer is appropriately formed according to the arrangement of the pixel electrodes. For example, the planar shape may be formed as a lattice shape. Incidentally, the pixels are demarcated by the insulating layer.

As the longitudinal cross-sectional shape of the insulating layer according to an embodiment of the present invention, a shape capable of exhibiting the function as the insulating layer according to an embodiment of the present invention may be employed without particular limitation; for example, a forward tapered shape, a reverse tapered shape, and a rectangular shape may be employed; and among them, the forward tapered shape is preferred. This is because the transparent electrode layer described later may be uniformly formed on the entire surface, so that a sufficient conduction can be obtained.

In the insulating layer in an embodiment of the present invention, when an overlap distance of the insulating layer between the later-described contact portion and the pixel electrode adjacent to the contact portion with respect to the pixel electrode is regarded as "a" and an overlap distance of the insulating layer between the later-described contact portion and the pixel electrode adjacent to the contact portion with respect to the auxiliary electrode is regarded as "b", at least one of "a" and "b" is equal to or greater than 2 μm. Within the range, it is preferable that at least one of "a" and "b" is in a range of equal to or greater than 3 μm, and particularly, it is preferable that at least one of "a" and "b" is in a range of equal to or greater than 5 μm. In addition, as the upper limits of the above-described "a" and "b" which is equal to or larger than the above-described distance, a distance to the extent that the distance does not exert a bad influence on the display characteristics of the organic EL display device according to an embodiment of the present invention may be employed without particular limitation, but it is preferable that the distance is 30 μm or less. The above-described at least one of "a" and "b" is in the above-described range, so that, as illustrated in FIG. 2A, the area of the highest region "H" in the top portion of the insulating layer 5 can be ensured so as to be a predetermined area or more. Therefore, in the production method illustrated in FIGS. 3A to 3F, as illustrated in FIG. 3D, when allowing the cover member 8 to be in contact with the insulating layer 5, a sufficient area where the cover member 8 is adhered in the insulating layer 5 is ensured, and thus, adhesion can be improved, and as a result, when removing the organic layer covering the auxiliary electrode 4 exposed from the opening of the insulating layer 5 by illuminating with the laser beam L, the organic layer removed by the laser beam L can be sufficiently prevented from being scattered into the pixel areas, so that deterioration in display characteristics can be suppressed.

Incidentally, "at least one of "a" and "b" is equal to or greater than 2 μm" denotes that at least one of the distance "a" and the distance "b" illustrated in FIGS. 2A to 2B is equal to or greater than 2 μm at any position of the region "r" illustrated in FIG. 1D. Therefore, for example, the configuration that the distance "a" is equal to or greater than 2 μm denotes that the overlap distance of the insulating layer with respect to the pixel electrode is equal to or greater than 2 μm at any position of the region "r" illustrated in FIG. 1D, and the configuration that the distance "b" is equal to or greater than 2 μm denotes that the overlap distance of the insulating layer with respect to the auxiliary electrode is equal to or greater than 2 μm at any position of the region "r" illustrated in FIG. 1D. In addition, the configuration that the distance "a" and the distance "b" are equal to or greater than 2 μm denotes that the overlap distances of the insulating layer with respect to the pixel electrode and the auxiliary electrode are equal to or greater than 2 μm at any position of the region "r" illustrated in FIG. 1D.

In addition, in an embodiment of the present invention, although at least one of the above-described "a" and "b" may be in the above-described range, it is preferable that both of the distance "a" and the distance "b" are in the above-described range. This is because the area of the highest region in the top portion of the insulating layer can be ensured more widely.

In addition, although any one of the distance "a" and the distance "b" may be large, it is preferable that the distance "b" is larger than the distance "a". In terms of an aperture ratio, it is preferable that the overlap distance of the insulating layer with respect to the pixel electrode is relatively small within a predetermined range. On the other hand, in terms of suppression of voltage drop, since it is preferable that the width of the auxiliary electrode is relatively large, the overlap distance "b" of the insulating layer with respect to the auxiliary electrode can be easily increased.

Figure 4A:
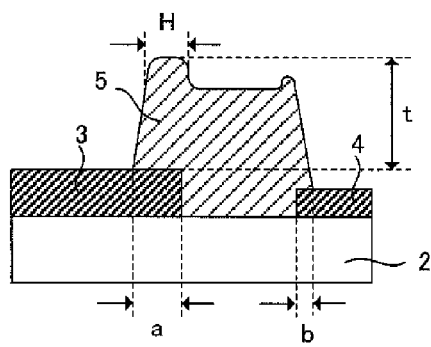
FIGS. 4A to 4C are schematic pattern diagrams illustrating an insulating layer in an embodiment of the present invention.
Figure 4B:
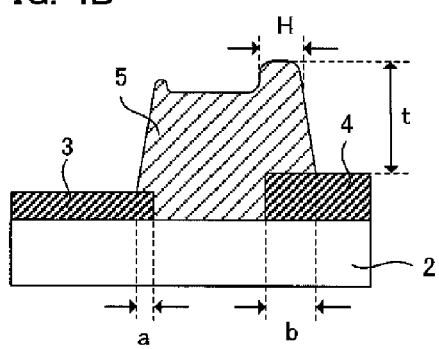

Incidentally, as the above-described distances "a" and "b", in the case where the pixel electrode and the auxiliary electrode are formed on the same plane, and as illustrated in FIG. 4A, in the case where the thickness of the later-described pixel electrode 3 is thicker than the thickness of the later-described auxiliary electrode 4, at least the distance "a" is equal to or greater than 2 μm; and as illustrated in FIG. 4B, in the case where the thickness of the pixel electrode 3 is thinner than the thickness of the auxiliary electrode 4, at least the distance "b" is equal to or greater than 2 μm. This is because the highest region "H" in the top portion of the insulating layer 5 is determined according to the thickness of the pixel electrode 3 and the thickness of the auxiliary electrode 4, and thus, the region "H" having a predetermined area or more corresponding to the size of the distance "a" or "b" can be obtained according to the size of the distance "a" or "b". Since the reference numerals not described in FIGS. 4A and 4B are the same as those of FIGS. 1A to 1D, the description thereof is omitted herein.

Figure 4C:
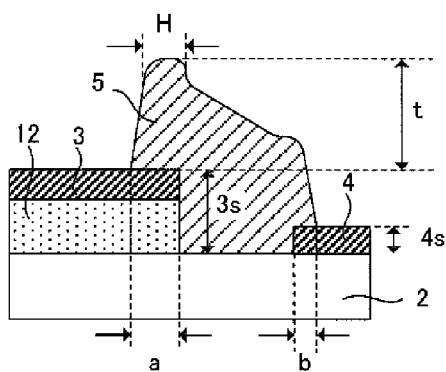

In addition, when the pixel electrode and the auxiliary electrode are not formed on the same plane, the distance "a" or "b" of one of the pixel electrode and the auxiliary electrode of which the height of the top surface is higher in the thickness direction of the organic EL display device is at least equal to or greater than 2 μm. Therefore, in FIG. 4C, in the case where a protective layer 12 is formed between the substrate 2 and the pixel electrode 3, and the auxiliary electrode 4 is formed at a position deeper than the pixel electrode 3 in the depth direction of the organic EL display device, and in the case where the height 3s of the top surface of the pixel electrode 3 is higher than the height 4s of the top surface of the auxiliary electrode 4, at least the distance "a" is equal to or greater than 2 μm; and although not shown, in the case where the height of the top surface of the auxiliary electrode is higher than the height of the top surface of the pixel electrode, at least the distance "b" is equal to or greater than 2 μm. This is because the highest region "H" in the top portion of the insulating layer is determined according to the heights of the top surfaces of the pixel electrode and the auxiliary electrode, and thus, the region "H" having a predetermined area or more corresponding to the size of the distance "a" or "b" can be obtained according to the size of the distances "a" and "b". Since the reference numerals not described in FIG. 4C are the same as those of FIGS. 1A to 1D, the description thereof is omitted herein.

Here, for example, as illustrated in FIG. 2A or FIGS. 4A to 4C, the configuration that the size of the highest region "H" in the top portion of the insulating layer 5 is "a predetermined area or more" denotes that, in the production method illustrated in, for example, FIGS. 3A to 3F, the size of the region "H" is a size to the extent that, when allowing the cover member 8 to be in contact with the insulating layer 5 as illustrated in FIG. 3D, the sufficient area where the cover member 8 is adhered to the insulating layer 5 can be ensured, so that the adhesion ban be improved. More specifically, it is preferable that the width of the region "H" is in a range of equal to or greater than 1 μm; within the range, it is preferable that the width is in a range of equal to or greater than 2 μm; and particularly, it is preferable that the width is in a range of equal to or greater than 3 μm. In addition, as the upper limit of the width of the region "H", any upper limit which is appropriately adjusted according to the length of the top portion of the insulating layer may be employed without particular limitation. Incidentally, in the case illustrated in FIG. 2A, the width of the region "H" here denotes a sum of the widths of the regions "H" of the insulating layer 5 corresponding to the overlap distance "a" of the insulating layer 5 with respect to the pixel electrode 3 and the overlap distance "b" of the insulating layer 5 with respect to the auxiliary electrode 4; and in the case illustrated in FIGS. 4A to 4C, the width of the region "H" denotes the width of the region "H" of the insulating layer 5 corresponding to any one of the overlap distance "a" of the insulating layer 5 with respect to the pixel electrode 3 and the overlap distance "b" of the insulating layer 5 with respect to the auxiliary electrode 4.

As the heights of the insulating layer, when the height of the insulating layer between the contact portion and the pixel electrode adjacent to the contact portion described later is regarded as "x", and the maximum height of the heights of the insulating layer other than the insulating layer between the contact portion and the pixel electrode adjacent to the contact portion is regarded as "y"; it is preferable that the following formula (1) is satisfied.

$$y - x \leq 0.05 \text{ μm} \tag{1}$$

In an embodiment of the present invention, it is preferable that the difference between the height "y" and the height "x" of the insulating layer is 0.05 μm or less, but within the range, it is preferable that the difference between the height "y" and the height "x" of the insulating layer is 0.00 μm or less, particularly, it is preferable that the difference between the height "y" and the height "x" of the insulating layer is −1.00 μm or less. In this manner, it is the most preferable that the height "x" and the height "y" of the insulating layer satisfy the relationship of x>y. The height "x" and the height "y" of the insulating layer satisfy the above-described condition, and thus, as illustrated in FIG. 3D, when the organic EL layer side substrate 1 and the cover member 8 are allowed to be in contact with each other, the insulating layer 5, which is in between the area illuminated with the laser beam L to form the contact portion and the adjacent pixel electrode 3, and the cover member 8 can be sufficiently adhered to each other. In this manner, the adhesion between the insulating layer of the two ends of the region where the contact portion is formed by illumination with the laser beam and the cover member is improved, and thus, the organic layer removed by illumination with the laser beam can be effectively prevented from being scattered into the adjacent pixel areas, so that deterioration in display characteristics can be suppressed.

Here, the height "x" of the insulating layer between the contact portion and the pixel electrode adjacent to the contact portion denotes the height of the lowest position among the heights from the surface of the pixel electrode 3 covered with the insulating layer 5 to the top portion of the insulating layer 5, in the insulating layer 5 between the contact portion 9 formed by removing at least one layer of the organic layers at the opening formed in the insulating layer 5 so as to expose the auxiliary electrode 4 and the pixel electrode 3 facing the contact portion 9, like the region "r" illustrated in FIG. 1D. In addition, the maximum height "y" among the heights of the insulating layers other than the insulating layer between the contact portion and the pixel electrode adjacent to the contact portion denotes the height of the highest position among the heights from the surface of the pixel electrode 3 covered with the insulating layer 5 to the top portion of the insulating layer 5 in regions other than the region "r" illustrated in FIG. 1D. Here, the height "x" denotes the distance "x" illustrated in FIG. 1B, and the height "y" denotes the distance "y" illustrated in FIG. 1C.

In addition, with respect to the heights "x" and "y" of the insulating layer, it is preferable that the above-described formula (1) is satisfied in a region having a radius of 0.5 mm centered at an arbitrary contact portion; within the region, it is preferable that the above-described formula (1) is satisfied in a region having a radius of 5 mm centered at an arbitrary contact portion, particularly, in a region having a radius of 50 mm centered at an arbitrary contact portion. In general, since waviness exists in a substrate such as a glass or a resin, in some case, the above-described formula (1) may not be satisfied with respect to the entire organic EL display device, but if the above-described formula (1) is satisfied in the above-described region, the above-described effect can be sufficiently obtained. Namely, in order to obtain the above-described effect, the above-described formula (1) does not need to be satisfied over the entire organic EL display device, but the above-described formula (1) may be satisfied in the above-described region.

Figure 7A:
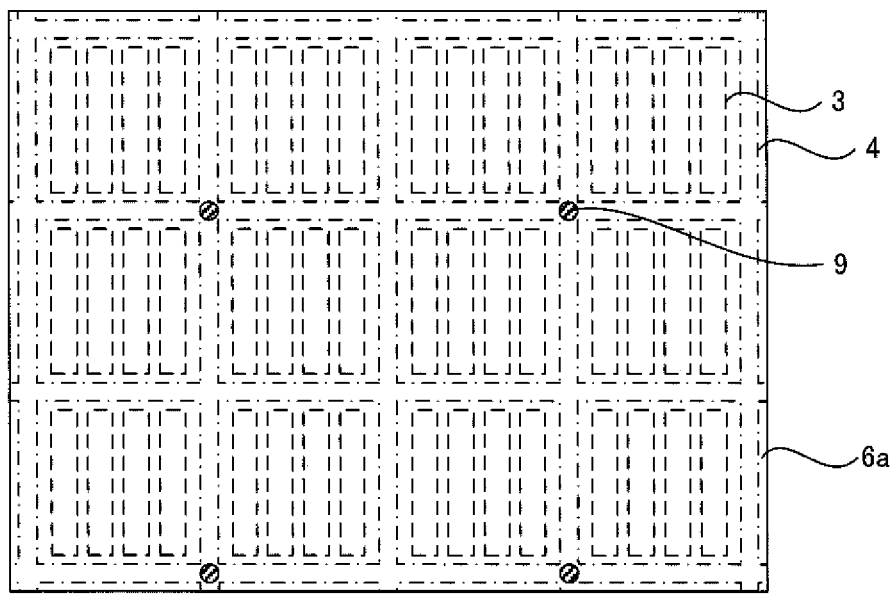
FIGS. 7A and 7B are schematic plan views illustrating another example of the top-emission organic EL display device according to an embodiment of the present invention.
Figure 7B:
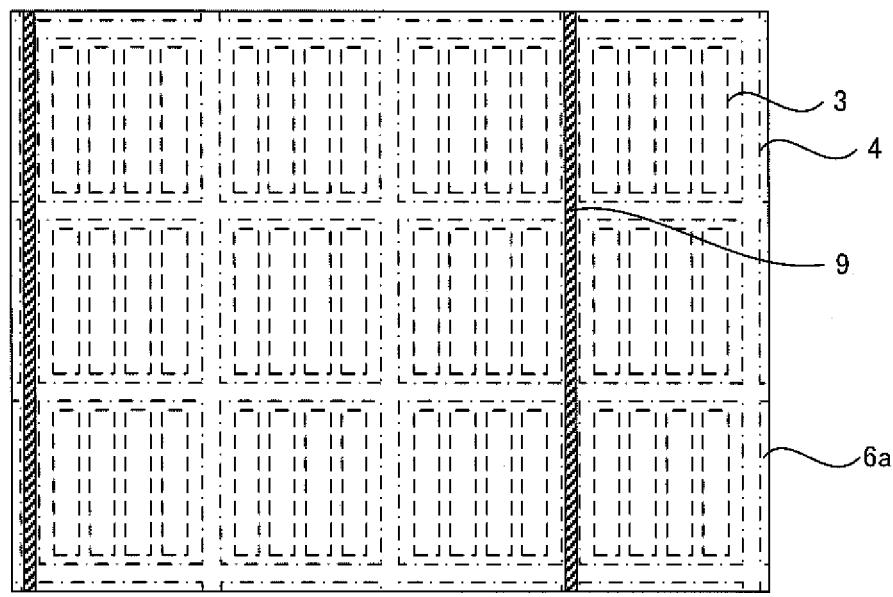

Here, the region, in which the radius centered at an arbitrary contact portion is within a predetermined range differs according to the shape of the contact portion. For example, as illustrated in FIG. 7A, in the case where the contact portion 9 is formed in a dot shape, the region may be a region having a predetermined radius centered at the center point of the dot-shaped contact portion 9. In addition, for example, as illustrated in FIG. 7B, in the case where the contact portion 9 is formed in a stripe shape, the region may be a region having a predetermined radius centered at an arbitrary point which is positioned on the central line of the stripe-shaped contact portion 9. In this case, it is preferable that the above-described formula (1) is satisfied over the entire region having a predetermined radius centered at an arbitrary point which is positioned on the central line of the stripe-shaped contact portion 9.

Figure 6A:
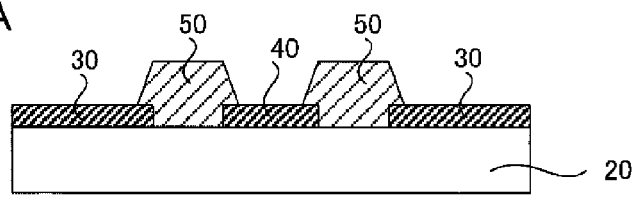
FIGS. 6A to 6E are process diagrams illustrating an example of a production method for a top-emission organic EL display device in the related art.
Figure 6B:
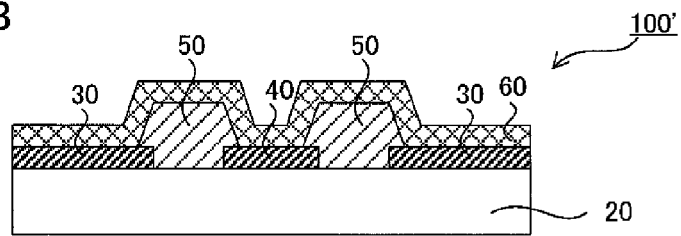
Figure 6C:
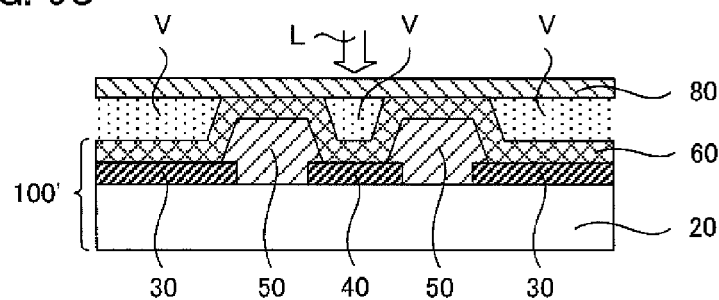
Figure 6D:
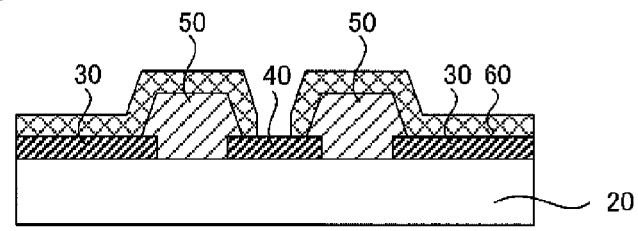
Figure 6E:
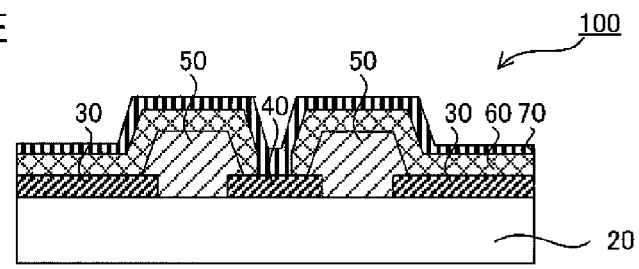

Incidentally, in FIGS. 7A and 7B, 6a is at least one layer of the organic layers formed on the auxiliary electrode 4 as well as the pixel electrodes 3, for facilitating explanation, the insulating layer, the organic EL layer, and the transparent electrode layer are omitted; the pixel electrode 3 is indicated by broken lines; and the auxiliary electrode 4 is indicated by alternate long and short dashed lines.

As the height of the insulating layer, if satisfying the above-described condition, in the case where the organic EL display device according to an embodiment of the present invention is produced by the production method illustrated in FIGS. 3A to 3F for example, when the organic EL layer side substrate 1 and the cover member 8 are allowed to face each other as illustrated in FIG. 3D, the height to the extent that the cover member can be arranged on the top portion of the insulating layer may be employed without particular limitation; for example, it is preferable that the width is equal to or greater than 1.2 μm; within the range, it is preferable that the width is equal to or greater than 2 μm; and particularly, it is preferable that the width is equal to or greater than 3 μm. The height of the insulating layer is set to be within the aforementioned range, so that as illustrated in FIG. 3D, when the organic EL layer side substrate 1 and the cover member 8 are allowed to face to be in contact with each other under the first pressure and, after that, the space P1 of the side of the cover member 8 opposite to the organic EL layer side substrate 1 is adjusted to the second pressure to adhere the organic EL layer side substrate 1 and the cover member 8, it is possible to prevent a problem in that the cover member 8 is bent to be in contact with the organic EL layer 6 formed on the pixel electrodes 3 to exert bad influence to the display characteristics of the organic EL display device. In addition, the space between the organic EL layer side substrate and the cover member can be sufficiently ensured, and thus, even in the case where a gas slightly enters the space, it is possible to prevent the vacuum degree of the space between the organic EL layer side substrate and the cover member from being abruptly decreased. In addition, as the upper limit of the height of the insulating layer, a height to the extent that the height does not exert a bad influence on the display characteristics of the organic EL display device according to an embodiment of the present invention may be employed without particular limitation, but for example, it is preferable that the width is 30 μm or less, and within the range, it is preferable that the width is 15 μm or less, and particularly, it is preferable that the width is 10 μm or less. The height of the insulating layer is set to be equal or lower than the numeric value, so that when the sealing substrate is arranged on the surface of the organic EL display device according to an embodiment of the present invention, it is possible to prevent the volume of the space between the organic EL display device and the sealing substrate from being increased. Therefore, the increase of the amount of the sealing material used for filling the space with the sealing material is prevented, so that it is possible to prevent the increase in cost and the decrease in transmittance. In addition, it is possible to prevent the problem such that the thickness of the organic EL display device is increased. The height of the insulating layer here denotes the highest position in the insulating layer and denotes a distance "t" from the surface of the pixel electrode 3 or the surface of the auxiliary electrode 4 to the top surface of the insulating layer 5 as illustrated in FIG. 2A and FIGS. 4A to 4C. Incidentally, "the surface of the pixel electrode or the surface of the auxiliary electrode" denotes the surface of the pixel electrode in the case where the height to the surface of the pixel electrode is highest among the heights from the surface of the substrate to the surface of the pixel electrode and the surface of the auxiliary electrode; and on the other hand, "the surface of the pixel electrode or the surface of the auxiliary electrode" denotes the surface of the auxiliary electrode in the case where the height to the surface of the auxiliary electrode is highest.

In addition, as the number of openings formed to expose the auxiliary electrode in the insulating layer, any number which can be appropriately adjusted according to the number of contact portions electrically connecting the auxiliary electrode and the transparent electrode may be employed without particular limitation.

In addition, as the size of the opening formed in the insulating layer, any size which can be appropriately adjusted according to the size of the contact portions or the number of contact portions described later may be employed without particular limitation. As a specific size of the opening of the insulating layer, it is preferable that the size is equal to or greater than 10 μm in the width direction or the longitudinal direction of the auxiliary electrode; within the range, it is preferable that the size is equal to or greater than 20 μm; and particularly, it is preferable that the size is equal to or greater than 30 μm. The size of the opening formed in the insulating layer is set to be in the aforementioned range, so that the area where the contact portion is to be formed in the opening can be sufficiently ensured. Therefore, the opening of the insulating layer can be surely illuminated with the laser beam, so that it is possible to easily form the contact portion in the opening of the insulating layer. Incidentally, the size of the opening of the insulating layer in the width direction, or the longitudinal direction of the auxiliary electrode is indicated by a distance "m" or a distance "n" illustrated in FIG. 1D; and "the size is equal to or greater than 10 μm in the width direction or the longitudinal direction of the auxiliary electrode" denotes that the larger distance in the sizes of the opening in the width direction and the longitudinal direction of the auxiliary electrode is equal to or greater than 10 μm.

As a material for the insulating layer, a general material for an insulating layer in an organic EL display device may be used; and for example, a light-sensitive polyimide resin, a photosetting resin such as an acrylic-based resin, a thermosetting resin, or an inorganic material may be used.

As the insulating layer forming method according to an embodiment of the present invention, general methods such as a lamination method, a photolithography method, and a printing method may be used.

2. Substrate

In an embodiment of the present invention, the substrate supports the above-described insulating layer and the later-described pixel electrode, auxiliary electrode, organic EL layer, and transparent electrode layer.

Since the organic EL display device according to an embodiment of the present invention is of a top emission type, the substrate may or may not have light transmissivity. In the case where the substrate has light transmissivity and, thus, the substrate is a transparent substrate, a double side light emission organic EL display device may be configured.

In addition, the substrate may or may not have flexibility, and the substrate is appropriately selected according to the use of the organic EL display device. As a material for the substrate, for example, a glass or a resin may be used. Incidentally, a gas barrier layer may be formed on the surface of the substrate.

The thickness of the substrate is appropriately selected according to the material for the substrate and the use of the organic EL display device, and more specifically, the thickness is in a range of about 0.005 mm to 5 mm.

3. Pixel Electrode

In an embodiment of the present invention, a plurality of the pixel electrodes are formed on the substrate.

The pixel electrode may or may not have light transmissivity; but since the organic EL display device according to an embodiment of the present invention is of a top emission type and emits light from the transparent electrode layer side, in general it is assumed that the organic EL display device does not have the light transmissivity. In addition, in the case where the pixel electrode has light transmissivity and, the pixel electrode is a transparent electrode, a double side light emission organic EL display device may be configured.

The pixel electrode may be any one of an anode and a cathode.

In the case where the pixel electrode is an anode, a pixel electrode having low resistance is preferred; and although, in general, a metal material as a conductive material is used, an organic compound or an inorganic compound may be used.

For the anode, it is preferable that a conductive material having a large work function is used so as to easily inject holes. For example, a metal such as Au, Cr, and Mo, an inorganic oxide such as indium tin oxide (ITO), indium zinc oxide (IZO), zinc oxide, and indium oxide, a conductive polymer such as a metal-doped polythiophene may be used. These conductive materials may be used alone or in combination of two or more thereof. In the case of using two or more thereof, layers made of respective materials may be laminated.

In addition, in the case where the pixel electrode is a cathode, although, in general, a metal material as a conductive material is used, an organic compound or an inorganic compound may be used.

For the cathode, it is preferable that a conductive material having a small work function is used so as to easily inject electrons. For example, a magnesium alloy such as MgAg, an aluminum alloy such as AlLi, AlCa, and AlMg, an alloy of an alkali metal such as Li, Cs, Ba, Sr, and Ca and an alloy of an alkaline earth metal may be used.

The thickness of the pixel electrode is appropriately adjusted according to existence or nonexistence of a leak current from the edge portion of the adjacent pixel electrode; for example, the thickness may be set to be in a range of about 10 nm to 1000 nm; and it is preferable that the thickness is in a range of about 20 nm to 500 nm. Incidentally, the thickness of the pixel electrode may be equal to or different from the thickness of the auxiliary electrode described later. Incidentally, in the case where the pixel electrode is formed integrally with the auxiliary electrode described later, the thickness of the pixel electrode and the thickness of the auxiliary electrode are equal to each other.

As a pixel electrode forming method, any method capable of forming the pixel electrodes on the substrate in a pattern shape may be employed without particular limitation, and a general electrode forming method may be employed. For example, a vapor deposition method or a photolithography method using a mask may be used. In addition, as the vapordeposition method, for example, a sputtering method or a vacuum deposition method may be used.

4. Auxiliary Electrode

In an embodiment of the present invention, the auxiliary electrode is formed between the pixel electrodes adjacent to each other.

The auxiliary electrode may or may not have light transmissivity.

For the auxiliary electrode, in general, a metal material as a conductive material is used. Incidentally, since the material used for the auxiliary electrode can be set to be the same as the above-described material used for the pixel electrode, the description thereof is omitted herein.

In addition, the material used for the auxiliary electrode may be the same as or different from the material used for the pixel electrode. Among the materials, it is preferable that the pixel electrode and the auxiliary electrode comprise the same material. This is because the pixel electrodes and the auxiliary electrode can be formed integrally, so that it is possible to simplify the production process.

The thickness of the auxiliary electrode is appropriately adjusted according to existence or nonexistence of a leak current from the edge portion of the auxiliary electrode; for example, it is preferable that the thickness is in a range of about 10 nm to 1000 nm; and within the range, it is preferable that the thickness is in a range of about 20 nm to 500 nm. Incidentally, in the case where the auxiliary electrode is formed integrally with the above-described pixel electrode, the thickness of the pixel electrode and the thickness of the auxiliary electrode are equal to each other.

In addition, when the auxiliary electrode is formed between the pixel electrodes adjacent to each other, as the clearance between the adjacent pixel electrode and the auxiliary electrode, any clearance to the extent that the later-described insulating layer can be formed may be employed without particular limitation. More specifically, it is preferable that the clearance is in a range of about 1 μm to 50 μm; and within the range, it is preferable that the clearance is in a range of about 2 μm to 30 μm. Incidentally, the clearance between the adjacent pixel electrode and the auxiliary electrode is indicated by the distance "d" illustrated in FIG. 3A.

As a shape of the auxiliary electrode when observed in the direction of the thickness of the auxiliary electrode, that is, as a planar shape, any shape capable of exhibiting a function of the auxiliary electrode of suppressing voltage drop caused by resistance of the transparent electrode layer may be employed without particular limitation; but a shape that does not deteriorate the light emitting efficiency of the organic EL display device is preferred. For example, a stripe shape or a lattice shape may be employed.

As an auxiliary electrode forming method, any method capable of forming the auxiliary electrodes on the substrate in a pattern shape may be employed without particular limitation, and a general electrode forming method may be employed. Since the specific auxiliary electrode forming method is the same as that of the above-described pixel electrode forming method, the description thereof is omitted herein. Incidentally, in an embodiment of the present invention, it is preferable that the auxiliary electrode is formed integrally with the pixel electrodes. This is because it is possible to simplify the production process.

5. Organic EL Layer

In an embodiment of the present invention, the organic EL layer is formed on the pixel electrode and comprises a plurality of the organic layers and includes at least the light-emitting layer. In addition, at least one layer of the organic layers is formed on the auxiliary electrode exposed from the opening of the insulating layer.

As the organic layers constituting the organic EL layer, beside the light-emitting layer, there are a hole injecting layer, a hole transporting layer, an electron injecting layer, and an electron transporting layer, for example. For this reason, the organic layers of at least a hole injecting layer, a hole transporting layer, an electron injecting layer, or an electron transporting layer, are formed on the auxiliary electrode exposed from the opening of the insulating layer.

Hereinafter, each of the organic layers constituting the organic EL layer will be described.

(1) Light-Emitting Layer

The light-emitting layer may be a mono-color light-emitting layer or a multi-color light-emitting layer; this is appropriately selected according to the use of the organic EL display device; but in general, the multi-color light-emitting layer is formed.

As the light emitting material used for the light-emitting layer, any material of emitting fluorescence or phosphorescence may be used; and for example, a dye-based material, a metal-complex-based material, or a polymer-based material, may be used. Incidentally, since specific materials of the dye-based material, the metal-complex-based material, and the polymer-based material are the same as generally used materials, the description thereof is omitted herein.

As the thickness of the light-emitting layer, any thickness capable of exhibiting a function of light emission by providing a recombination site to the electrons and the holes may be employed without particular limitation, and for example, the thickness may be set to be in a range of about 10 nm to 500 nm.

As the light-emitting layer forming method, for example, a wet process, which is to coat with a light-emitting layer formation coating solution where a light emitting material is dissolved or dispersed in a solvent, or a dry process such as a vacuum deposition method may be used. Among the processes, in terms of influence on a light emitting efficiency and a life cycle of the organic EL display device, the dry process is preferred.

(2) Hole Injecting/Transporting Layer

As the organic EL layer according to an embodiment of the present invention, a hole injecting/transporting layer may be formed between the light-emitting layer and the anode.

The hole injecting/transporting layer may be a hole injecting layer having a hole injection function, may be a hole transporting layer having a hole transport function, may be a layer formed by laminating the hole injecting layer and the hole transporting layer, or may be a layer having both of the hole injection function and the hole transport function.

As a material used for the hole injecting/transporting layer, a material capable of stabilizing hole injection/transport into the light-emitting layer may be employed without particular limitation, and a general material may be used.

As the thickness of the hole injecting/transporting layer, a thickness by which a hole injection function or a hole transport function can be sufficiently exhibited may be employed without particular limitation, but more specifically, the thickness is in a range of about 0.5 nm to 1000 nm, and within the range, it is preferable that the thickness is in a range of about 10 nm to 500 nm.

As the hole injecting/transporting layer forming method, a method capable of forming the hole injecting/transporting layer on at least the pixel electrode may be employed without particular limitation, and the hole injecting/transporting layer forming method is appropriately selected according to a type of the material, for example. For example, a wet process, which is to coat with a hole injecting/transporting layer formation coating solution where a material is dissolved or dispersed in a solvent, or a dry process such as a vacuum deposition method may be used.

(3) Electron Injecting/Transporting Layer

As the organic EL layer according to an embodiment of the present invention, an electron injecting/transporting layer may be formed between the light-emitting layer and the cathode.

The electron injecting/transporting layer may be an electron injecting layer having an electron injection function, may be an electron transporting layer having an electron transport function, may be a layer formed by laminating the electron injecting layer and the electron transporting layer, or may be a layer having both of the electron injection function and the electron transport function.

As a material used for the electron injecting layer, a material capable of stabilizing electron injection into the light-emitting layer may be employed without particular limitation; and as a material used for the electron transporting layer, a material capable of transporting electrons injected from the cathode to the light-emitting layer may be employed without particular limitation.

As a specific material used for the electron injecting layer and the electron transporting layer, a general material may be used.

As the thickness of the electron injecting/transporting layer, a thickness by which an electron injection function or an electron transport function can be sufficiently exhibited may be employed without particular limitation.

The electron injecting/transporting layer forming method is appropriately selected according to a type of the material, for example. For example, a wet process, which is to coat with an electron injecting/transporting layer formation coating solution where a material is dissolved or dispersed in a solvent, or a dry process such as a vacuum deposition method may be used.

6. Contact Portion

In an embodiment of the present invention, the contact portion is the opening of the organic layer formed on the auxiliary electrode exposed from the opening of the insulating layer.

As the planar shape of the contact portion according to an embodiment of the present invention, a planar shape capable of sufficiently eclectically connecting the transparent electrode layer and the auxiliary electrode described later may be employed without particular limitation, but for example, a rectangular shape or a circular shape may be used.

Figure 5A:
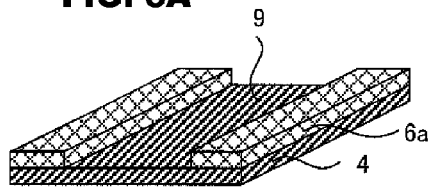
FIGS. 5R to 5C are schematic pattern diagrams illustrating a contact portion in an embodiment of the present invention.
Figure 5B:
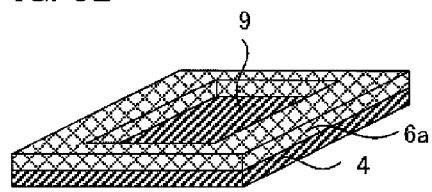
Figure 5C:
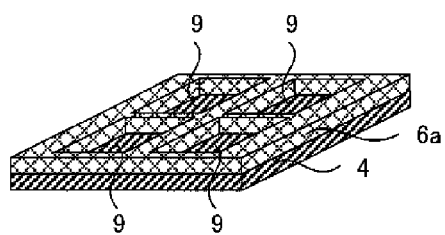

In addition, as an aspect of the contact portion, a contact portion which can sufficiently electrically connect the later-described transparent electrode layer and the auxiliary electrode may be employed without particular limitation. FIGS. 5A to 5C are schematic views illustrating aspects of the contact portion in an embodiment of the present invention. As specific aspects of the contact portion 9, as illustrated in FIG. 5A, the contact portion may have an aspect formed by removing at least one layer of the organic layers 6a formed on the auxiliary electrode 4 in a stripe shape; as illustrated in FIG. 53, the contact portion may have an aspect formed by providing an opening to at least one layer of the organic layers 6a formed on the auxiliary electrode 4; and as illustrated in FIG. 5C, the contact portion may have an aspect formed by providing a plurality of openings to at least one layer of the organic layers 6a formed on the auxiliary electrode 4.

In an embodiment of the present invention, as the contact portion forming method, for example, as illustrated in FIG. 3D, a method of forming the contact portion by removing the organic layer covering the auxiliary electrode 4 by illuminating the organic EL layer side substrate 1 with the laser beam L through the cover member 8 may be employed.

As the laser beam used when forming the contact portions, any laser beam capable of removing the organic layer covering the auxiliary electrode by transmitting the cover member when illuminating with the laser beam through the cover member may be employed without particular limitation; and a laser beam generally used for a method of removing an organic layer by a laser beam may be employed. As a wavelength range of the laser beam, any wavelength range capable of efficiently removing the organic layer by transmitting the cover member used in the above-described method may be employed without particular limitation, but for example, a UV range is preferred. As a specific UV range, it is preferable that the UV range is in a range of about 300 nm to 400 nm; within the range, it is preferable that the UV range is in a range of about 320 nm to 380 nm; and particularly, it is preferable that the UV range is in a range of about 340 nm to 360 nm. As a laser beam having the wavelength range, for example, a solid state laser such as YAG and $YVO_4$, an excimer laser such as XeCl and XeF, or a semiconductor laser may be employed.

In addition, as the laser beam, a pulse laser or a continuous wave laser may be used; but, among them, the pulse laser is preferred. Since the pulse laser has a high peak value, the organic layer covering the auxiliary electrode can be efficiently removed. On the other hand, since the pulse laser is a high power laser, there is a problem in that the organic layer removed by the pulse laser is easily scattered and the wide area of the pixel area may be contaminated. In contrast, since the scattering of the organic layer can be prevented in an embodiment of the present invention, the present disclosure is useful to the case of using the pulse laser.

In the case of the pulse laser, it is preferable that the pulse width is in a range of about 0.01 nanoseconds to 100 nanoseconds. In addition, it is preferable that a repetition frequency is in a range of about 1 kHz to 1000 kHz. Any power capable of removing the organic layer may be employed, and the power is appropriately adjusted.

7. Transparent Electrode Layer

In an embodiment of the present invention, the transparent electrode layer is formed on the organic EL layer and the contact portion.

With respect to the transparent electrode layer, a material having a transparent property and conductivity may be employed, and for example, a metal oxide may be employed. As a specific metal oxide, indium tin oxide, indium oxide, indium zinc oxide, zinc oxide, and stannic oxide may be used. In addition, a metal material such as a magnesium-silver alloy, aluminum, and calcium may be used if a thin layer is formed by using the material to the extent that the thin layer has light transmissivity.

In an embodiment of the present invention, as the transparent electrode layer forming method, a method capable of forming the organic EL layer and the transparent electrode layer on the contact portion so as to be electrically connected to the auxiliary electrode exposed in the contact portion may be used without particular limitation, and a general electrode forming method may be used. For example, a PVD method or a CVD method such as a vacuum deposition method, a sputtering method, an EB vapor deposition method, and an ion plating method may be used.

8. Other Configurations

Embodiments of the present invention are not particularly limited to the above-described configurations, but other configurations may be used. As other configurations, for example, a sealing substrate of sealing the organic EL display device may be used Hereinafter, the sealing substrate will be described.

Since the organic EL display device according to an embodiment of the present invention is of a top emission type, the sealing substrate has light transmissivity. As the light transmissivity of the sealing substrate, it is preferable that the sealing substrate has light transmissivity with respect to the wavelength of the visible light range; more specifically, it is preferable that the transmittance with respect to the entire wavelength range of the visible light range is equal to or greater than 80%; within the range, it is preferable that the transmittance is equal to or greater than 85%; and particularly, it is preferable that the transmittance is equal to or greater than 90%.

Here, the transmittance may be measured, for example, by a UV visible spectrometer UV-3600™ produced by Shimadzu.

In addition, the sealing substrate may or may not have flexibility, and this is appropriately selected according to the use of the organic EL display device.

As the material for the sealing substrate, a material capable of obtaining the sealing substrate having a light transmissivity may be employed without particular limitation, and for example, an inorganic material such as quartz and glass or a resin such as an acrylic resin, a cycloolefin polymer referred to as COP, polycarbonate, polyethylene terephthalate, polybutylene terephthalate, polyphenylene sulfide, polyimide, polyamide imide, polyether sulfone, polyether imide, polyether ether ketone may be used. In addition, a gas barrier layer may be formed on the surface of the sealing substrate made of a resin.

The thickness of the sealing substrate is appropriately selected according to the material of the sealing substrate and the use of the organic EL display device. More specifically, the thickness of the sealing substrate is in a range of about 0.001 mm to 5 mm.

9. Organic EL Display Device

The organic EL display device according to an embodiment of the present invention may be of a type of emitting light at least from the transparent electrode layer side, may be of a top emission type of emitting light from the transparent electrode layer side, or may be of a double side light emission type of emitting light from both of the transparent electrode layer side and the pixel electrode side.

B. Production Method of Organic EL Display Device

In a production method for an organic EL display device according to an embodiment of the present invention, the organic EL display device comprises a substrate, a plurality of pixel electrodes formed on the substrate, an auxiliary electrode formed between the pixel electrodes adjacent to each other, an insulating layer which is formed between the adjacent pixel electrodes so as to cover edge portions of the adjacent pixel electrodes and comprises an opening so as to expose the auxiliary electrode, an organic EL layer which is formed on the pixel electrode, comprises a plurality of organic layers, and includes at least a light-emitting layer, at least one layer of the organic layers formed on the auxiliary electrode exposed from the opening of the insulating layer, a contact portion which is an opening of the organic layer formed on the auxiliary electrode exposed from the opening of the insulating layer, and a transparent electrode layer formed on the organic EL layer and the contact portion; in which when an overlap distance of the insulating layer between the contact portion and the pixel electrode adjacent to the contact portion with respect to the pixel electrode is regarded as "a" and an overlap distance of the insulating layer between the contact portion and the pixel electrode adjacent to the contact portion with respect to the auxiliary electrode is regarded as "b", at least one of "a" and "b" is equal to or greater than 2 µm, and the transparent electrode layer is electrically connected to the auxiliary electrode in the contact portion, and the production method for an organic EL display device comprises processes of: an organic EL layer side substrate preparing process of preparing an organic EL layer side substrate comprising the substrate, the pixel electrodes, the auxiliary electrode, the insulating layer, and the organic EL layer, and at least one layer of the organic layers is formed on an entire surface of the auxiliary electrode; an arrangement process of arranging a cover member to face the organic EL layer side substrate obtained in the organic EL layer side substrate preparing process under a first pressure, so that the cover member is in contact with a top portion of the insulating layer by the intermediary of the organic layer; an adhering process of adhering the organic EL layer side substrate and the cover member by adjusting a space on an opposite side to the organic EL layer side substrate, in relation to the cover member, to have a second pressure which is higher than the first pressure; and a contact portion forming process of forming the contact portion by removing the organic layers covering the auxiliary electrode exposed from the opening of the insulating layer by illuminating with a laser beam through the cover member.

FIGS. 3A to 3F are process diagrams illustrating an example of the production method for the organic EL display device according to an embodiment of the present invention. Incidentally, since the detailed description of FIGS. 3A to 3F are the same as the contents explained in the above-described Section "A. Organic EL Display Device", the description thereof is omitted herein.

According to an embodiment of the present invention, when an overlap distance of the insulating layer between the contact portion and the pixel electrode adjacent to the contact portion with respect to the pixel electrode is regarded as "a" and an overlap distance of the insulating layer between the contact portion and the pixel electrode adjacent to the contact portion with respect to the auxiliary electrode is regarded as "b", at least one of "a" and "b" is equal to or greater than 2 µm, so that the organic layers removed by the laser beam in the contact portion forming process can be effectively prevented from being scattered into the pixel areas, so that it is possible to obtain the organic EL display device capable of suppressing deterioration in display characteristics. Incidentally, since the detailed reasons for the above-described effects are the same as those described in the above-described Section "A. Organic EL Display Device", the description thereof is omitted herein.

Here, in an embodiment of the present invention, the configuration that "the cover member is arranged so as to be in contact with the top portion of the insulating layer by the intermediary of the organic layer" includes an aspect as illustrated in FIG. 3D where the cover member 8 is arranged to be in contact with the top portion of the insulating layer 5 via the organic EL layer 6 or an aspect (not shown) where the cover member is arranged to be in contact with the top portion of the insulating layer via at least one layer of the organic layers.

Hereinafter, each of the processes comprising the production method for the organic EL display device according to an embodiment of the present invention will be described.

1. Organic EL Layer Side Substrate Preparing Process

In an embodiment of the present invention, the organic EL layer side substrate preparing process is a process of preparing the organic EL layer side substrate comprising the substrate, the pixel electrodes, the auxiliary electrode, the insulating layer, and the organic EL layer, and at least one layer of the organic layers is formed on an entire surface of the auxiliary electrode.

Hereinafter, each of the processes comprising the organic EL layer side substrate preparing process will be described.

(1) Pixel Electrode/Auxiliary Electrode Forming Process

In an embodiment of the present invention, the pixel electrode/auxiliary electrode forming process is a process of forming a plurality of pixel electrodes on a substrate and forming an auxiliary electrode between the pixel electrodes adjacent to each other.

Since the substrate, the pixel electrodes, and the auxiliary electrode used in this process are set to be the same as those described in the above-described Sections "A. Organic EL Display Device 2. Substrate" through "A. Organic EL Display Device 4. Auxiliary Electrode", the description thereof is omitted herein.

(2) Insulating Layer Forming Process

In an embodiment of the present invention, the insulating layer forming process is a process of forming an insulating layer between adjacent pixel electrodes to cover edge portions of the adjacent pixel electrodes. Incidentally, the insulating layer formed in this process includes an opening so as to expose the auxiliary electrode.

Since the insulating layer formed in this process can be set to be the same as that described in the above-described Section "A. Organic EL Display Device 1. Insulating Layer", the description thereof is omitted herein.

(3) Organic EL Layer Forming Process

In an embodiment of the present invention, the organic EL layer forming process is a process of forming the organic EL layer which comprises a plurality of organic layers and includes at least a light-emitting layer on the pixel electrode.

In addition, in this process, the organic EL layer is formed, and at least one layer of the organic layers comprising the organic EL layer is formed so as to cover the auxiliary electrode exposed from the opening of the insulating layer. For example, in the case where the light-emitting layer is coated on each pixel of the organic EL display device, the hole injecting/transporting layer or the electron injecting/transporting layer is formed on the pixel electrode and on the auxiliary electrode, so that the light-emitting layers are formed on the pixel electrodes in a pattern shape. Incidentally, in the case where the organic layers such as a hole injecting/transporting layer or an electron injecting/transporting layer is formed on the pixel electrode and on the auxiliary electrode, the organic layers are consecutively formed on the pixel electrode and on the auxiliary electrode in general.

Incidentally, in an embodiment of the present invention, for example, in this process, a hole injecting/transporting layer a light-emitting layer, and an electron transporting layer may be formed, and after that, after the later-described arrangement process and contact portion forming process, an electron injecting layer may be formed. This is because, in the case where the electron injecting layer formed after the arrangement process and the contact portion forming process is formed on the contact portion in the auxiliary electrode as well as on the pixel electrodes, if the thickness of the electron injecting layer is very thin, the auxiliary electrode can be allowed to be electrically connected to the transparent electrode layer formed by the later-described transparent electrode layer forming process in the contact portion. In this manner, in the case where the electron injecting layer is formed after the contact portion forming process, deterioration in the electron injecting layer caused by the arrangement process, the adhering process, and the contact portion forming process can be prevented, so that a material such as lithium fluoride which is considered to be relatively unstable can be used as the material for the electron injecting layer.

Since the organic EL layer formed in this process can be set to be the same as that described in the above-described Section "A. Organic EL Display Device 5. Organic EL Layer", the description thereof is omitted herein.

2. Arrangement Process

In an embodiment of the present invention, the arrangement process is a process of allowing the cover member to face the organic EL layer side substrate obtained in the organic EL layer side substrate preparing process and allowing the cover member to be in contact with the top portion of the insulating layer by the intermediary of the organic layer under a first pressure.

Hereinafter, the cover member used in this process and a specific arrangement process will be described.

(1) Cover Member

As the cover member used in this process, any cover member capable of setting the space between the organic EL layer side substrate and the cover member to be in a reduced pressure state by allowing the cover member to face the organic EL layer side substrate may be employed without particular limitation; and for example, a material having light transmissivity such as a glass film, COP, PP, PC, and PET may be used. Among the materials, a glass film and COP are preferred.

As the thickness of the cover member, a thickness to the extent that the space between the organic EL layer side substrate and the cover member can be set to be in a reduced pressure state by allowing the organic EL layer side substrate and the cover member to face each other under the first pressure may be employed without particular limitation. For example, it is preferable that the thickness is in a range of about 1 μm to 1000 μm; within the range, it is preferable that the thickness is in a range of about 10 μm to 200 μm; and particularly, it is preferable that the thickness is in a range of about 30 μm to 100 μm.

As the cover member, a cover member having a predetermined barrier property to a gas is preferred. The cover member has a predetermined barrier property to the gas, and thus the space between the cover member and the organic EL layer side substrate is allowed to be in a reduced pressure state in this process, and after that, until the later-described contact portion forming process is performed, the space between the cover member and the organic EL layer side substrate can be maintained to be in a reduced pressure state. For this reason, this is because, when the organic layer on the auxiliary electrode is to be removed by the laser beam in the contact portion forming process, the sufficient adhesion between the cover member and the organic EL layer side substrate is maintained, and thus, the removed organic layers can be prevented from being scattered into the pixel areas. As the barrier property of the cover member to a gas, any barrier property to the extent that the cover member can exhibit the above-described effects may be employed without particular limitation; for example, it is preferable that an oxygen permeability of the cover member is 100 cc/m$^2$·day or less; within the range, it is preferable that the oxygen permeability is 30 cc/m$^2$·day or less; and particularly, it is preferable that the oxygen permeability is 15 cc/m$^2$·day or less.

In addition, a barrier layer may be formed on the surface of the cover member. The cover member includes the barrier layer, so that, in the later-described contact portion forming process, a gas from the space of the side of the cover member opposite to the organic EL layer side substrate and the cover member can be effectively prevented from being entered into the space between the organic EL layer side substrate and the cover member.

As a material for the barrier layer used for the cover member, any material capable of exhibiting a desired barrier property to the gas such as oxygen or nitrogen and transmitting the laser beam used in the later-described contact portion forming process may be employed without particular limitation; and for example, an inorganic material may be used. As a specific inorganic material, for example, a silicon oxide, a silicon nitride, a silicon carbide, a titanium oxide, a niobium oxide, an indium oxide, a zinc oxide, a tin oxide, a tantalum oxide, an aluminum oxide, a magnesium oxide, a calcium oxide, and a zirconium oxide, may be used. In addition, as a barrier layer, a glass film may be used.

As the thickness of the barrier layer, any thickness to the extent that the cover member can obtain the above-described average transmittance when the barrier layer is formed on the cover member used in this process may be employed without particular limitation; for example, it is preferable that the thickness is in a range of about 10 nm to 800 nm; within the range, it is preferable that the thickness is in a range of about 50 nm to 500 nm; and particularly, it is preferable that the thickness is in a range of about 70 nm to 300 nm.

As the method of forming the barrier layer on the surface of the cover member used in this process, for example, a sputtering method, a vacuum deposition method, and plasma CVD method may be used. In addition, a barrier layer is formed alone, and the barrier layer may be adhered to the surface of the cover member by using an adhesive layer made of an adhesive material. As the adhesive material used for the adhesive layer, any adhesive material capable of adhering to the surface of the cover member with a desired strength and transmitting the laser beam used in the later-described contact portion forming process may be employed without particular limitation; and for example, a polycarbonate-based resin, a polyolefin-based resin, an acrylic-based resin, a urethane-based resin, a silicon-based resin, a polyester-based resin, and an epoxy-based resin may be used. In addition, as the thickness of the adhesive layer, a thickness to the extent that the cover member and the barrier layer can be sufficiently adhered to each other may be employed without particular limitation; and more specifically, the thickness may be set in a range of about 5 μm to 50 μm.

In the case where the cover member used in this process includes the barrier layer, the barrier layer may be arranged on one surface of the cover member or may be arranged on both surfaces of the cover member. Incidentally, in the case where the barrier layer is arranged on one surface of the cover member, when the cover member and the organic EL layer side substrate are allowed to face each other, the barrier layer on the cover member may be arranged on the side of the organic EL layer side substrate or may be arranged on the opposite side of the organic EL layer side substrate.

In addition, in the case of using a glass film as the cover member, the resin layer may be formed on one surface or both surfaces of the glass film. Breakage of the glass film can be suppressed. As the resin layer, a resin substrate may be used. As a material used for the resin substrate, for example, polyethylene naphthalate (PEN), polyethylene terephthalate (PET), polyether sulfone (PES) polyimide (PI), polyether ether ketone (PEEK), polycarbonate (PC), polyethylene (PE), polypropylene (PP), polyphenylene sulfide (PPS), polyether imide (PEI), cellulose triacetate (CTA), cyclic polyolefin (COP), polymethyl methacrylate (PMMA), poly sulfone (PSF), polyimide imide (PAI), a norbornene resin, and an allyl ester resin may be used.

As the thickness of the resin substrate, any thickness capable of obtaining a cover member having flexibility may be employed without particular limitation; for example, it is preferable that the thickness is in a range of about 3 μm to 200 μm; and it is more preferable that the thickness is in a range of about 5 μm to 200 μm.

The resin substrate can be adhered to the glass film via an adhesive layer. Incidentally, the adhesive layer may be set to be the same as the above-described adhesive layer.

(2) Arrangement process

This process is a process of setting the space between the organic EL layer side substrate and the cover member to be in a reduced pressure state.

Incidentally, in an embodiment of the present invention, as the "arrangement process of arranging the cover member to face the organic EL layer side substrate obtained in the organic EL layer side substrate preparing process under a first pressure so that the cover member is in contact with the top portion of the insulating layer by the intermediary of the organic layer", the following method may be used. Namely, first, a method of arranging the cover member to face the organic EL layer side substrate where a sealing material is formed in the outer periphery thereof in the vacuum chamber of which the predetermined vacuum degree is set to the first pressure and allowing the organic EL layer side substrate and the cover member to be in contact with each other or a method of allowing the organic EL layer side substrate and the cover member to be in contact with each other by using a jig, for example, in the vacuum chamber which is set to the first pressure may be employed.

In the case of using the jig, any jig capable of allowing the organic EL layer side substrate and the cover member to be in contact with each other may be used; for example, a jig of fixing by interposing the organic EL layer side substrate and the cover member may be used and a jig of fixing by interposing only the cover member so that the cover member is not bent may be used.

In addition, it is preferable that the jig can seal the space of the side of the cover member opposite to the organic EL layer side substrate. More specifically, a frame-shaped jig may be used. This is because, for example, the frame-shaped jigs are arranged on the both surfaces of the cover member, and the cover member is pressed on the laser beam transmitting window of the vacuum chamber via the frame-shaped jig arranged on the surface of the side of the cover member opposite to the organic EL layer side substrate, and thus, the space of the side of the cover member opposite to the organic EL layer side substrate can be sealed, so that the pressure of the space of the side of the cover member opposite to the organic EL layer side substrate can be adjusted in the later-described adhering process. In this case, the organic EL layer side substrate can be mounted on, for example, a stage which can be moved in up/down direction, and thus, the stage is moved upwards to allow the organic EL layer side substrate to be in contact with the cover member fixed by the frame-shaped jig, so that the space between the organic EL layer side substrate and the cover member can be set to be in a reduced pressure state. As the frame-shaped jig arranged on the surface of the side of the cover member opposite to the organic EL layer side substrate, for example, an O-ring may be used.

The space between the organic EL layer side substrate and the cover member has a predetermined vacuum degree which is a first pressure. More specifically, any case where the space of the side of the cover member opposite to the organic EL layer side substrate is adjusted to have a second pressure in the later-described adhering process to generate a pressure difference between the space between the organic EL layer side substrate and the cover member and the space of the side of the cover member opposite to the organic EL layer side substrate, and thus, the organic EL layer side substrate and the cover member can be sufficiently adhered to each other, so that, in the later-described contact portion forming process, dust of the organic layers removed by the laser beam can be prevented from being scattered into the pixel areas may be employed without particular limitation; but the case where the value of the vacuum degree is high as possible, that is, the case where the value of pressure of the space between the organic EL layer side substrate and the cover member is low as possible is preferred. Among the cases, in this process, it is preferable that the space between the organic EL layer side substrate and the cover member is a vacuum space. As a specific vacuum degree, it is preferable that the vacuum degree is in a range of about $1 \times 10^{-5}$ Pa to $1 \times 10^4$ Pa; within the range, it is preferable that the vacuum degree is in a range of about $1 \times 10^{-5}$ Pa to $1 \times 10^3$ Pa; and particularly, it is preferable that the vacuum degree is in a range of about $1 \times 10^{-5}$ Pa to $1 \times 10^2$ Pa.

3. Adhering Process

In an embodiment of the present invention, an adhering process of allowing the organic EL layer side substrate and the cover member to be adhered to each other by adjusting the space of the side of the cover member opposite to the organic EL layer side substrate to have a second pressure, which is higher than the first pressure, is performed.

Hereinafter, a specific adhering process will be described.

This process is a process of adjusting the space of the side of the cover member opposite to the organic EL layer side substrate to have the second pressure, which is higher than the first pressure, to generate a pressure difference between the space between the organic EL layer side substrate and the cover member and the space of the side of the cover member opposite to the organic EL layer side substrate, so that the organic EL layer side substrate and the cover member are allowed to be adhered to each other.

When the space of the side of the cover member opposite to the organic EL layer side substrate is to be adjusted to have the second pressure, at least the space of the side of the cover member opposite to the organic EL layer side substrate may be adjusted to have the second pressure; for example, only the space of the side of the cover member opposite to the organic EL layer side substrate may be adjusted to have the second pressure; and the outer peripheral space of the cover member and the organic EL layer side substrate may be adjusted to have the second pressure.

As a method of adjusting the space of the side of the cover member opposite to the organic EL layer side substrate to have the second pressure, any method capable of generating a pressure difference between the space between the organic EL layer side substrate and the cover member and the space of the side of the cover member opposite to the organic EL layer side substrate so that the organic EL layer side substrate and the cover member can be adhered to each other may be employed without particular limitation; but for example, the following method may be employed. Namely, there is a method of exposing the organic EL layer side substrate and the cover member which are in contact with each other in the vacuum chamber into a normal-pressure space to return the outer peripheral space of the organic EL layer side substrate and the cover member to the normal pressure, or a method of setting the space between the organic EL layer side substrate and the cover member to be a reduced pressure state in the vacuum chamber and, after that, pressuring by flowing a gas into the vacuum chamber, for example. Incidentally, as the "normal-pressure space" in the case of performing the adhering process by the method of exposing the organic EL layer side substrate and the cover member into the normal-pressure space, in terms of suppressing the deterioration of the organic EL display device, it is preferable that, for example, an oxygen concentration and an moisture concentration of the space are at least 1 ppm or less and the space is filled with nitrogen or an inert gas such as argon. In addition, in the case of pressuring by flowing the gas into the vacuum chamber, the gas may be allowed to be flowed into the entire vacuum chamber, or the gas may be allowed to be flowed into only the space of the side of the cover member opposite to the organic EL layer side substrate. As described above, for example, in the case of using the frame-shaped jig, the space of the side of the cover member opposite to the organic EL layer side substrate can be sealed, so that the organic EL layer side substrate and the cover member can be adhered to each other by flowing the gas into the space. As the gas flowing into the vacuum chamber, for the above-described reasons, nitrogen or an inert gas such as argon is preferred.

As the above-described "second pressure", any pressure which is higher than the first pressure in the arrangement process and any pressure to the extent that the cover member can be adhered to the organic EL layer side substrate by the pressure difference between the first pressure and the second pressure may be employed without particular limitation; for example, it is preferable that the second pressure is 100 Pa or more higher than the first pressure; within the range, it is preferable that the second pressure is 1000 Pa or more higher; and particularly, it is preferable that the second pressure is 10000 Pa or more higher. The pressure difference between the second pressure and the first pressure is set to be equal to or higher than the aforementioned numeric value, so that the cover member can be sufficiently adhered to the organic EL layer side substrate.

4. Contact Portion Forming Process

The contact portion forming process according to an embodiment of the present invention is a process of forming the contact portion by removing the organic layer covering the auxiliary electrode exposed from the opening of the insulating layer by illuminating with the laser beam through the cover member As described in the above-described Section "2. Arrangement Process", this process is performed in the state where a predetermined pressure difference exists between the space between the organic EL layer side substrate and the cover member and at least the space of the side of the cover member opposite to the organic EL layer side substrate. Incidentally, in the case of using the method of pressuring by flowing a gas into the vacuum chamber as the above-described adhering process, for example, this process may be performed by the following method. Namely, a method of forming the contact portion by removing the organic layer covering the auxiliary electrode by illuminating with the laser beam through a laser beam transmitting window installed in the vacuum chamber which comprises a light-transmissive substrate such as a glass may be used.

Since the contact portions formed in this process can be set to be the same as those described in the above-described Section "A. Organic EL Display Device 6. Contact Portion", the description thereof is omitted herein.

5. Transparent Electrode Layer Forming Process

The transparent electrode layer forming process according to an embodiment of the present invention is a process of forming a transparent electrode layer on the organic EL layer side substrate by peeling off the cover member so as to be electrically connected to the auxiliary electrode exposed in the contact portion.

In this process, since the space between the organic EL layer side substrate and the cover member is returned to the normal pressure by peeling off the cover member from the top portion of the insulating layer, the pressure difference between the space between the organic EL layer side substrate and the cover member and at least the space of the side of the cover member opposite to the organic EL layer side substrate disappears.

Since the transparent electrode layer formed in this process can be set to be the same as that described in the above-described Section "A. Organic EL Display Device 7. Transparent Electrode Layer", the description thereof is omitted herein.

6. Other Processes

In an embodiment of the present invention, the configuration comprising the above-described processes may be employed without particular limitation, but other processes may be included. As other processes, for example, a sealing substrate forming process of sealing the organic EL display device may be used.

Incidentally, since the sealing substrate is the same as that described in Section "A. Organic EL Display Device 8. Other Configurations", the description thereof is omitted herein.

The present disclosure is not limited to the above-described embodiments. The embodiments are exemplary ones, and thus, any ones including substantially the same configurations as the claims of the disclosure and exhibiting the same functions and effects are included in the technical scope of the disclosure.

EXAMPLES

Hereinafter, examples of an embodiment of the present invention will be described in detail.

Example 1

(Pixel Electrode/Auxiliary Electrode Forming Process)

A chromium film having a thickness of 150 nm is formed on a substrate comprising an alkali-free glass having a thickness of 0.7 mm by a sputtering method. After that, pixel electrodes and auxiliary electrodes are simultaneously formed by a photolithography method.

(Insulating Layer Forming Process)

Next, an insulating layer is formed between the pixel electrodes to cover edge portions of, the adjacent pixel electrodes and to include openings exposing the auxiliary electrodes by a photolithography method. Incidentally, the longitudinal cross-sectional shape of the insulating layer is a forward tapered shape. In addition, when an overlap distance of the insulating layer between the contact portion and the pixel electrode adjacent to the contact portion with respect to the pixel electrode is regarded as "a" and an overlap distance of the insulating layer between the contact portion and the pixel electrode adjacent to the contact portion with respect to the auxiliary electrode is regarded as "b", the size of at least one of "a" and "b" is adjusted as listed in the following Table 1. Incidentally, here, the size of at least one of "a" and "b" indicates "a" and "b" illustrated in FIG. 2A and FIGS. 4A and 4B, and the height of the insulating layer indicates "x" illustrated in FIG. 1B and FIG. 2A.

TABLE 1

| No. | Size of at least one of "a" and "b" (μm) | Height (μm) | Remarks |
|---|---|---|---|
| 1 | 1 | 1.2 | Comparative Example |
| 2 | 2 | | Examples |
| 3 | 3 | | |
| 4 | 5 | | |

(Organic EL Layer Forming Process)

Next, a hole injecting layer having a thickness of 0.1 μm is formed on the pixel electrode, and after that, a light-emitting layer having a thickness of 0.3 μm is formed on the hole injecting layer. After that, an electron transporting layer having a thickness of 0.3 μm is formed on the light-emitting layer, so that an organic EL layer is obtained. Incidentally, the organic EL layer is formed on the pixel electrode and is formed on the auxiliary electrode exposed from the opening of the insulating layer.

(Sealing Material Forming Process)

A sealing material is formed in the outer periphery of the pattern of the organic EL layer side substrate by using a dispenser.

(Arrangement Process and Adhering Process)

Next, inside the vacuum chamber of which the vacuum degree is set to be 50 Pa, the cover member is allowed to face the organic EL layer side substrate, and the cover member is allowed to be in contact with the surface of the organic EL layer side substrate, so that the space between the organic EL layer side substrate and the cover member is set to be in a reduced pressure state. After that, a nitrogen gas is flowed into the vacuum chamber, and thus, the inner pressure of the chamber is returned to the normal pressure, so that the organic EL layer side substrate and the cover member are allowed to be adhered to each other. Incidentally, for the cover member, a PET film having a thickness of 100 μm is used.

(Contact Portion Forming Process)

Next, by illuminating with a shot of a YAG laser beam having an energy of 500 mJ/cm², a spot diameter of 10 μmφ, a wavelength of 355 nm, and a pulse width of 5 nsec through the cover member, the hole injecting layer, the light-emitting layer and the electron transporting layer covering the aux-iliary electrode are removed to expose the auxiliary electrode, so that the contact portion is formed.

(Electron Injecting Layer and Transparent Electrode Layer Forming Process)

After that, the cover member is peeled off, and a film is formed by a vacuum deposition method so that a thickness of lithium fluoride is 0.5 nm and the film is electrically connected to the auxiliary electrode exposed in the contact portion, and thus, an electron injecting layer is formed. Next, a film is formed by a vacuum deposition method so that a thickness of calcium is 10 nm and a thickness of aluminum is 5 nm, and thus, a transparent electrode layer is formed.

(Sealing Process)

Sealing is performed by adhering the organic EL display device produced as described above and the sealing substrate applied with an adhesive material.

(Evaluation)

The insulating layers of Nos. 1 to 4 listed in Table 1 are used, the space between the cover member and the organic EL layer side substrate is set to be in a reduced pressure state, after that, existence of the scattering of the organic layer on the surface of the organic EL layer into the pixel areas when the adhering process and the contact portion forming process are performed is observed. The case where the organic layers removed by the laser beam in the contact portion forming process are prevented from being scattered into the pixel areas and, thus, deterioration in display characteristics can be prevented is evaluated as "A"; the case where the organic layers removed by the laser beam in the contact portion forming process are scattered over the pixel areas to a small extent but the deterioration in display characteristics can be prevented is evaluated as "B"; and the case where the organic layers removed by the laser beam in the contact portion forming process are scattered into the pixel areas and, thus, display characteristics are deteriorated is evaluated as "C".

The evaluation result is listed in Table 2.

TABLE 2

| No. | Evaluation Result | Remarks |
|---|---|---|
| 1 | C | Comparative Example |
| 2 | B | Examples |
| 3 | A | |
| 4 | A | |

It is recognized that, as Nos. 2 to 4 listed in Table 2, when an overlap distance of the insulating layer between the contact portion and the pixel electrode adjacent to the contact portion with respect to the pixel electrode is regarded as "a" and an overlap distance of the insulating layer between the later-described contact portion and the pixel electrode adjacent to the contact portion with respect to the auxiliary electrode is regarded as "b", the size of at least one of "a" and "b" is equal to or greater than 2 μm, and thus, even in the case of forming the contact portion by removing the organic layers on the auxiliary electrode by the laser beam, deterioration in display characteristics of the organic EL display device caused by the scattering of dust, for example, of the organic layers removed by the laser beam can be prevented. In addition, as Nos. 3 and 4, it is recognized that at least one of "a" and "b" is equal to or greater than 3 μm, so that dust, for example, of the organic layers removed by the laser beam can be sufficiently prevented from being scattered, and deterioration in display characteristics of the organic EL display device can be effectively prevented.

Example 2

When the height of the insulating layer between the contact portion and the pixel electrode adjacent to the contact portion is regarded as "x" and the maximum height of the heights of the insulating layers other than the insulating layer between the contact portion and the pixel electrode adjacent to the contact portion is regarded as "y", the organic EL display device is produced by the same method as that of Example 1 except that y-x is designed as listed in the following Table 3.

TABLE 3

| No. | y-x (μm) |
|---|---|
| 5 | 0.2 |
| 6 | 0.1 |
| 7 | 0.05 |
| 8 | 0.01 |

(Evaluation)

The insulating layers are designed as Nos. 5 to 8 listed in Table 3, the space between the cover member and the organic EL layer side substrate is set to be in a reduced pressure state to adhere the organic EL layer side substrate and the cover member, and after that, the organic layers formed on the auxiliary electrodes are removed by the laser beam through the cover member. At this time, existence of the scattering of the organic layer on the surface of the organic EL layer into the pixel areas is observed. The case where the organic layer removed by the laser beam are prevented from being scattered into the pixel areas and, thus, deterioration in display characteristics can be prevented is evaluated as "A"; and the case where the organic layer removed by the laser beam in the contact portion forming process are scattered over the pixel areas to a small extent but the deterioration in display characteristics can be prevented is evaluated as "B".

The evaluation result is listed in Table 4.

TABLE 4

| No. | Evaluation Result |
|---|---|
| 5 | B |
| 6 | |
| 7 | A |
| 8 | |

It is recognized that, as listed in Table 4, y-x is 0.05 μm or less, and thus, the insulating layer between the contact portion and the pixel electrode adjacent to the contact portion and the cover member can be sufficiently adhered to each other, so that the organic layer removed by the laser beam in the contact portion forming process can be effectively prevented from being scattered into the pixel areas.

Example 3

The organic EL display device is produced by setting the same as Example 1 except that the organic EL layer forming process is performed as illustrated below.

(Organic EL Layer Forming Process)

Next, a hole injecting layer and a hole transporting layer are formed on the pixel electrode so as to have a thickness of 0.1 μm and, after that, a light-emitting layer having 0.02 μm is formed on the hole transporting layer. After that, an electron transporting layer having a thickness of 0.03 μm is formed on the light-emitting layer, so that an organic EL layer is obtained. Incidentally, the organic EL layer is formed on the pixel electrode and is formed on the auxiliary electrode exposed from the opening of the insulating layer.

(Evaluation)

The same result as that of Example 1 is obtained.

REFERENCE SIGNS LIST

1: organic EL layer side substrate
2: substrate
3: pixel electrode
4: auxiliary electrode
5: insulating layer
6: organic EL layer
7: transparent electrode layer
8: cover member
9: contact portion
10: top-emission organic EL display device

What is claimed is:

1. A production method for a top-emission organic electroluminescence display device, the top-emission organic electroluminescence display device comprising a substrate, a plurality of pixel electrodes formed on the substrate, an auxiliary electrode formed between the pixel electrodes adjacent to each other, an insulating layer which is formed between the adjacent pixel electrodes so as to cover edge portions of the adjacent pixel electrodes and comprises an opening so as to expose the auxiliary electrode, an organic electroluminescence layer which is formed on the pixel electrodes, comprises a plurality of organic layers, and includes at least a light-emitting layer, at least one layer of the organic layers formed on the auxiliary electrode exposed from the opening of the insulating layer, a contact portion which is an opening of the organic layer formed on the auxiliary electrode exposed from the opening of the insulating layer, and a transparent electrode layer formed on the organic electroluminescence layer and the contact portion; wherein an overlap distance of the insulating layer between the contact portion and the pixel electrode adjacent to the contact portion with respect to the pixel electrode is regarded as "a" and an overlap distance of the insulating layer between the contact portion and the pixel electrode adjacent to the contact portion with respect to the auxiliary electrode is regarded as "b", at least one of "a" and "b" is equal to or greater than 2 μm, and the transparent electrode layer is electrically connected to the auxiliary electrode in the contact portion, the production method for a top-emission organic electroluminescence display device comprising processes of:

a preparing process of preparing an organic electroluminescence layer device comprising the substrate, the pixel electrodes, the auxiliary electrode, the insulating layer, and the organic electroluminescence layer, wherein at least one layer of the organic layers is formed on an entire surface of the auxiliary electrode;

an arrangement process of arranging a cover member, under a first pressure, to face the organic electroluminescence layer device obtained in the preparing process, so that the cover member is in contact with a top portion of the insulating layer via the organic layer;

an adhering process of adhering the organic electroluminescence layer device and the cover member by adjusting a space on an opposite side to the organic electroluminescence layer device, in relation to the cover member, under a second pressure that is higher than the first pressure; and a contact portion forming process of forming the contact portion by removing the organic layers covering the auxiliary electrode exposed from the opening of the insulating layer by illuminating with a laser beam through the cover member.

* * * * *